US010241411B2

(12) United States Patent
Kaur et al.

(10) Patent No.: US 10,241,411 B2
(45) Date of Patent: Mar. 26, 2019

(54) TOPCOAT COMPOSITIONS CONTAINING FLUORINATED THERMAL ACID GENERATORS

(71) Applicant: Rohm and Haas Electronic Materials LLC, Marlborough, MA (US)

(72) Inventors: Irvinder Kaur, Northborough, MA (US); Doris Kang, Shrewsbury, MA (US); Cong Liu, Shrewsbury, MA (US); Gerhard Pohlers, Needham, MA (US); Mingqi Li, Shrewsbury, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 0 days.

(21) Appl. No.: 15/730,870

(22) Filed: Oct. 12, 2017

(65) Prior Publication Data

US 2018/0118968 A1  May 3, 2018

Related U.S. Application Data

(60) Provisional application No. 62/414,843, filed on Oct. 31, 2016.

(51) Int. Cl.

| | |
|---|---|
| *G03F 7/11* | (2006.01) |
| *H01L 21/027* | (2006.01) |
| *G03F 7/40* | (2006.01) |
| *G03F 7/38* | (2006.01) |
| *C09D 133/10* | (2006.01) |
| *G03F 7/00* | (2006.01) |
| *G03F 7/004* | (2006.01) |
| *G03F 7/32* | (2006.01) |
| *G03F 7/20* | (2006.01) |
| *G03F 7/16* | (2006.01) |

(52) U.S. Cl.
CPC .............. *G03F 7/11* (2013.01); *C09D 133/10* (2013.01); *G03F 7/0002* (2013.01); *G03F 7/0046* (2013.01); *G03F 7/2041* (2013.01); *G03F 7/327* (2013.01); *G03F 7/38* (2013.01); *G03F 7/40* (2013.01); *H01L 21/0274* (2013.01); *G03F 7/16* (2013.01)

(58) Field of Classification Search
CPC ..... G03F 7/11; G03F 7/38; G03F 7/40; H01L 21/0274
USPC ............. 430/322, 271.1, 325, 329, 331, 913
See application file for complete search history.

(56) References Cited

U.S. PATENT DOCUMENTS

| | | | | |
|---|---|---|---|---|
| 4,368,247 A | * | 1/1983 | Fletcher, Jr. ............. | G03C 1/73 430/17 |
| 5,100,768 A | * | 3/1992 | Niki ....................... | G03F 7/0045 430/270.1 |
| 8,741,541 B2 | | 6/2014 | Ichikawa et al. | |
| 9,274,427 B2 | | 3/2016 | Wang et al. | |
| 9,540,834 B2 | * | 1/2017 | Spicer .................... | E04H 4/084 |
| 2007/0087286 A1 | | 4/2007 | Wang et al. | |
| 2007/0212646 A1 | | 9/2007 | Gallagher et al. | |
| 2009/0136878 A1 | * | 5/2009 | Kanna ...................... | C09D 7/65 430/325 |
| 2010/0183976 A1 | | 7/2010 | Wang et al. | |
| 2010/0183977 A1 | | 7/2010 | Wang et al. | |
| 2010/0304290 A1 | | 12/2010 | Wang et al. | |
| 2011/0293900 A1 | | 12/2011 | Tomeba et al. | |
| 2012/0264053 A1 | | 10/2012 | Wang | |
| 2013/0171561 A1 | | 7/2013 | Han et al. | |
| 2014/0295348 A1 | * | 10/2014 | Wang ...................... | C08L 33/16 430/270.1 |
| 2015/0177615 A1 | | 6/2015 | Jain et al. | |
| 2015/0212414 A1 | | 7/2015 | Pohlers et al. | |
| 2015/0323869 A1 | * | 11/2015 | Liu ....................... | C09D 201/02 430/273.1 |
| 2016/0187783 A1 | | 6/2016 | Kaur et al. | |
| 2017/0123313 A1 | * | 5/2017 | Kaur .................... | C07D 213/61 |
| 2017/0123314 A1 | * | 5/2017 | Kaur ..................... | G03F 7/2022 |
| 2017/0336709 A1 | * | 11/2017 | Lee ........................ | G03F 7/091 |

FOREIGN PATENT DOCUMENTS

| | | | |
|---|---|---|---|
| JP | 2001136714 A | | 5/2001 |
| JP | 2010209137 A | | 9/2010 |
| JP | 2013145841 A | | 7/2013 |
| JP | 2016210732 A | * | 12/2016 |

OTHER PUBLICATIONS

Machine translation of JP 2016-210732 (no date).*
Sanders, et al, "Self-segregating materials for immersion lithography", Advances in Resist Materials and Processing Technology XXV, Proc. of SPIE, 2008, pp. 692309-1-692309-12, vol. 6923.
U.S. Appl. No. 15/297,556, filed Oct. 19, 2016.
U.S. Appl. No. 15/297,545, filed Oct. 19, 2016.
Search report for corresponding Taiwan Application No. 106135779 dated Sep. 17, 2018.

* cited by examiner

*Primary Examiner* — Amanda C. Walke
(74) *Attorney, Agent, or Firm* — Jonathan D. Baskin

(57) ABSTRACT

Provided are topcoat compositions that include: a matrix polymer; a surface active polymer; an ionic thermal acid generator comprising an anion and a cation, wherein the anion, the cation, or the anion and the cation are fluorinated; and a solvent. Also provided are coated substrates and pattern-forming methods which make use of the topcoat compositions. The invention has particular applicability in photolithographic processes as a photoresist topcoat layer in the manufacture of semiconductor devices.

20 Claims, No Drawings

TOPCOAT COMPOSITIONS CONTAINING FLUORINATED THERMAL ACID GENERATORS

FIELD

This invention relates to topcoat compositions that may be applied above a photoresist composition in a photolithographic process. The invention further relates to coated substrates and methods of forming patterns using the topcoat compositions. The invention finds particular applicability in the semiconductor manufacturing industry for forming semiconductor devices.

BACKGROUND

One approach to achieving nanometer (nm)-scale feature sizes in semiconductor devices is to use shorter wavelengths of light when exposing photoresist layers. However, the difficulty in finding materials that are transparent below 193 nm exposure wavelength has led to the immersion lithography process to increase the numerical aperture of the lens by use of a liquid to focus more light into the film. Immersion lithography employs a relatively high refractive index fluid between the last surface of an imaging device and the first surface on the substrate being treated, for example, a semiconductor wafer.

In immersion lithography, direct contact between the immersion fluid and photoresist layer can result in leaching of components of the photoresist into the immersion fluid. This leaching can cause contamination of the optical lens and bring about a change in the effective refractive index and transmission properties of the immersion fluid. In an effort to address this problem, topcoat materials have been developed for use in forming a barrier layer between the immersion fluid and underlying photoresist layer. See, for example, U.S. Patent App. Pub. Nos. 2007/0212646A1 to Gallagher et al., and 2007/0087286 and 2010/0183976A1 to Wang et al.

In patterning high aspect ratio photoresist line-space patterns, the occurrence of resist pattern collapse has been observed. Pattern collapse is believed to take place during the resist development process due to the surface tension effects which can become magnified with decreasing spacing between high aspect ratio resist patterns.

There is a need in the art for topcoat compositions that address one or more problems associated with the state of the art, and for pattern-forming methods making use of such materials.

SUMMARY

In accordance with a first aspect of the application, provided are topcoat compositions. The topcoat compositions comprise: a matrix polymer; a surface active polymer; an ionic thermal acid generator comprising an anion and a cation, wherein the anion, the cation, or the anion and the cation are fluorinated; and a solvent.

In accordance with a further aspect of the invention, coated substrates are provided. The coated substrates comprise: a semiconductor substrate; a photoresist layer over the semiconductor substrate; and a topcoat layer formed from a topcoat composition as described herein over the photoresist layer.

In accordance with a further aspect of the invention, pattern-forming methods are provided. The pattern-forming methods comprise: (a) forming a photoresist layer over a substrate; (b) forming a topcoat layer over the photoresist layer, wherein the topcoat layer is formed from a topcoat composition as described herein; (c) exposing the topcoat layer and the photoresist layer to activating radiation; and (d) contacting the exposed topcoat layer and photoresist layer with a developer to form a photoresist pattern.

Various materials and groups that are "optionally substituted" may be suitably substituted at one or more available positions, typically at a position otherwise occupied by a hydrogen atom. Except as otherwise indicated, "substituted" shall be understood to mean including at least one non-hydrogen substituent such as a halogen (i.e., F, Cl, Br, I), hydroxyl, amino, thiol, carboxyl, carboxylate, ester, ether, amide, nitrile, sulfide, disulfide, nitro, $C_{1-18}$ alkyl, $C_{1-18}$ alkenyl (including norbornenyl), $C_{1-18}$ alkoxyl, $C_{2-18}$ alkenoxyl (including vinyl ether), $C_{4-18}$ aryl, $C_{6-18}$ aryloxyl, $C_{7-18}$ alkylaryl, or $C_{7-18}$ alkylaryloxyl, optionally including one or more heteroatom. As used herein: "Mw" means weight average molecular weight; "Mn" means number average molecular weight; "PDI" means polydispersity index=Mw/Mn; "copolymer" is inclusive of polymers containing two or more different types of polymerized units; "alkyl," "alkylene" and the like are inclusive of linear, branched and cyclic structures; and the articles "a" and "an" are inclusive of one or more unless otherwise indicated.

DETAILED DESCRIPTION

Topcoat Compositions

The topcoat compositions of the invention comprise a matrix polymer, a surface active polymer, an ionic thermal acid generator (TAG), a solvent, and can include one or more additional, optional components.

Topcoat compositions of the invention that are applied above a photoresist layer can be self-segregating, and can minimize or prevent migration of components of the photoresist layer into an immersion fluid employed in an immersion lithography process. As used herein, the term "immersion fluid" means a fluid, typically water, interposed between a lens of an exposure tool and a photoresist coated substrate to conduct immersion lithography.

Also as used herein, a topcoat layer will be considered as inhibiting the migration of photoresist material into an immersion fluid if a decreased amount of acid or organic material is detected in the immersion fluid upon use of the topcoat composition relative to the same photoresist system that is processed in the same manner, but in the absence of the topcoat composition layer. Detection of photoresist material in the immersion fluid can be conducted through mass spectroscopy analysis of the immersion fluid before exposure to the photoresist (with and without the overcoated topcoat composition layer) and then after lithographic processing of the photoresist layer (with and without the overcoated topcoat composition layer) with exposure through the immersion fluid. Preferably, the topcoat composition provides at least a 10 percent reduction in photoresist material (e.g., acid or organics as detected by mass spectroscopy) residing in the immersion fluid relative to the same photoresist that does not employ any topcoat layer (i.e., the immersion fluid directly contacts the photoresist layer), more preferably the topcoat composition provides at least a 20, 50, or 100 percent reduction in photoresist material residing in the immersion fluid relative to the same photoresist that does not employ a topcoat layer.

Topcoat compositions of the invention can allow for beneficial water contact angle characteristics that are important in an immersion lithography process, for example, static contact angle, receding contact angle, advancing contact angle and sliding angle at the immersion fluid interface. Topcoat compositions of the invention can further provide topcoat layers having excellent developer solubility for both exposed and unexposed regions of the layer, for example, in an aqueous base developer.

The compositions can be used in dry lithography or more typically in immersion lithography processes. The exposure wavelength is not particularly limited except by the photoresist compositions, with wavelengths of less than 300 nm, for example, 248 nm, 193 nm or an EUV wavelength (e.g., 13.4 or 13.5 nm) being typical. Use of the compositions in a 193 nm immersion lithography process is particularly preferred.

The topcoat compositions of the invention include two or more different polymers. Polymers useful in the invention may be homopolymers, but more typically include a plurality of distinct repeat units, with two or three distinct units, i.e., copolymers or terpolymers, being typical. The polymers are preferably aqueous alkali soluble such that a topcoat layer formed from the composition can be completely removed in the resist development step using an aqueous alkaline developer, for example, a quaternary ammonium hydroxide solution such as an aqueous tetra methyl ammonium hydroxide (TMAH) solution.

A variety of polymers may be employed in the topcoat compositions of the invention, including polymers comprising polymerized acrylate groups, polyesters, and other repeat units and/or polymer backbone structures such as provided by, for example, poly(alkylene oxide), poly(meth)acrylic acid, poly (meth)acrylamides, polymerized aromatic (meth)acrylates, and polymerized vinyl aromatic monomers. Typically, the polymers each include at least two differing repeat units. The different polymers suitably may be present in varying relative amounts.

The polymers of the topcoat compositions of the invention may contain a variety of repeat units, including, for example, one or more: hydrophobic groups; weak acid groups; strong acid groups; branched optionally substituted alkyl or cycloalkyl groups; fluoroalkyl groups; or polar groups, such as ester, ether, carboxy, or sulfonyl groups. The presence of particular functional groups on the repeat units of the polymers will depend, for example, on the intended functionality of the polymer.

In certain preferred aspects, one or more polymers of the coating composition will comprise one or more groups that are reactive during lithographic processing, for example, one or more photoacid-acid labile groups that can undergo cleavage reactions in the presence of acid and heat, such as acid-labile ester groups (e.g., t-butyl ester groups such as provided by polymerization of t-butyl acrylate or t-butyl-methacrylate, adamantylacrylate) and/or acetal groups such as provided by polymerization of a vinyl ether compound. The presence of such groups can render the associated polymer(s) more soluble in a developer solution, thereby aiding in developability and removal of the topcoat layer during a development process.

The polymers can advantageously be selected to tailor characteristics of the topcoat layer, with each generally serving one or more purpose or function. Such functions include, for example, one or more of photoresist profile adjusting, topcoat surface adjusting, reducing defects and reducing interfacial mixing between the topcoat and photoresist layers.

The matrix polymer may include one or more repeating units, with two repeating units being typical. The matrix polymer should provide a sufficiently high developer dissolution rate for reducing overall defectivity due, for example, to micro-bridging. A typical developer dissolution rate for the matrix polymer is greater than 300 nm/second, preferably greater than 500 nm/second and more preferably greater than 1000 nm/second. The matrix polymers can be fluorinated or non-fluorinated. For some photoresist materials, fluorinated topcoat matrix polymers can reduce or minimize interfacial mixing between the topcoat layer and underlying photoresist layer. Accordingly, one or more repeating unit of the matrix polymer can be fluorinated, for example, with a fluoroalkyl group such as a C1 to C4 fluoroalkyl group, typically fluoromethyl, and may be present, for example, as a sulfonamide group (e.g., —NHSO$_2$CF$_3$) or a fluoroalcohol group (e.g., —C(CF$_3$)$_2$OH). The matrix polymer preferably has a higher surface energy than that of, and is preferably immiscible with, the surface active polymer, to allow the surface active polymer to phase separate from the matrix polymer and migrate to the upper surface of the topcoat layer away from the topcoat photoresist interface. The surface energy of the matrix polymer is typically from 30 to 60 mN/m.

Exemplary matrix polymers in accordance with the invention include the following:

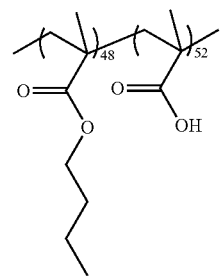

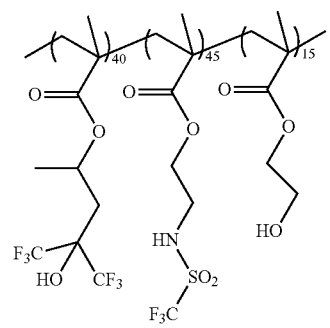

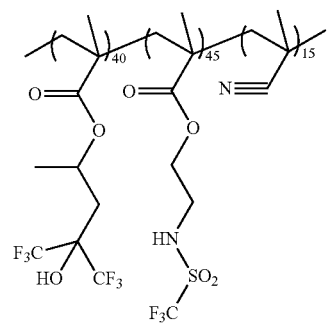

-continued

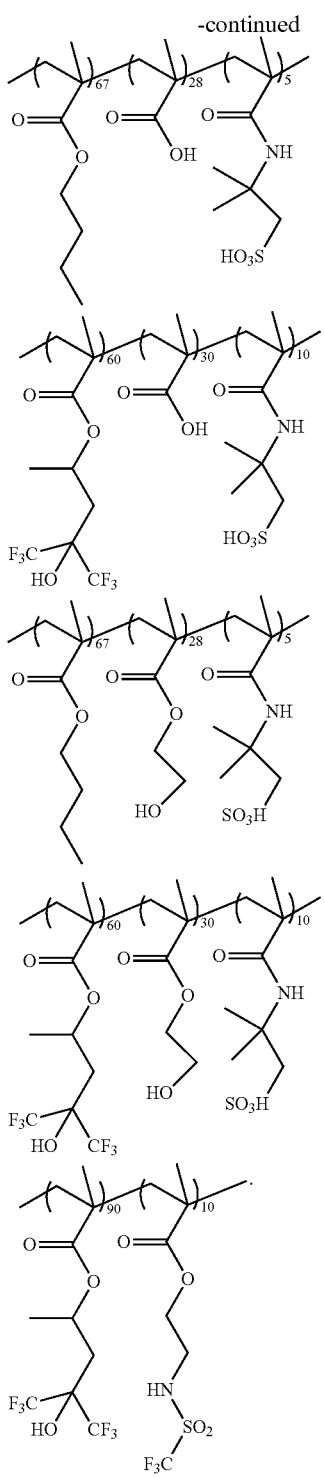

The matrix polymer is typically present in the compositions in an amount of from 70 to 99 wt %, more typically from 85 to 95 wt %, based on total solids of the topcoat composition. The weight average molecular weight of the matrix polymer is typically less than 400,000, for example, from 5000 to 50,000, from 5000 to 15,000 or from 5000 to 25,000 Daltons.

The surface active polymer is provided in the topcoat compositions to improve surface properties at the topcoat/immersion fluid interface. In particular, the surface active polymer beneficially can provides desirable surface properties with respect to water, for example, one or more of improved static contact angle (SCA), receding contact angle (RCA), advancing contact angle (ACA) and sliding angle (SA) at the topcoat/immersion fluid interface. In particular, the surface active polymer can provide a high RCA, which can allow for fast scan speeds, resulting in high process throughput. A layer of the topcoat composition in a dried state typically has a water receding contact angle of from 60 to 90°, preferably from 70 to 90° and more preferably from 75 to 90°. The phrase "in a dried state" means containing 8 wt % or less of solvent, based on the entire composition.

The surface active polymer is preferably aqueous alkali soluble. The surface active polymer preferably has a lower surface energy than the matrix polymer. Preferably, the surface active polymer has a significantly lower surface energy than and is substantially immiscible with the matrix polymer, as well as any other polymers present in the overcoat composition. In this way, the topcoat composition can be self-segregating, wherein the surface active polymer migrates to the upper surface of the topcoat layer apart from other polymers during coating. The resulting topcoat layer can thereby be rich in the surface active polymer at the topcoat layer upper surface which, in the case of an immersion lithography process is at the topcoat//immersion fluid interface. While the desired surface energy of the surface active polymer will depend on the particular matrix polymer and its surface energy, the surface active polymer surface energy is typically from 25 to 35 mN/m, preferably from 25 to 30 mN/m. The surface active polymer is typically from 5 to 25 mN/m less than that of the matrix polymer, preferably from 5 to 15 mN/m less than that of the matrix polymer.

The surface active polymer can be a homopolymer or, preferably, a copolymer comprising two or more different types of polymerized units. Suitable types of units for the surface active polymer include, for example, those containing one or more group chosen from fluoroalcohol, acid labile, base labile, sulfonamide, alkyl and ester groups. Preferably, such acid labile, base labile, sulfonamide, alkyl and ester groups are fluorinated. Of these, the surface active polymer preferably comprises one or more acid labile or base labile groups to enhance solubility in a developer solution after exposure to activating radiation and post-exposure baking.

Exemplary units for use in the surface active additive polymer in accordance with the invention include polymerized units of one or more of the following monomers:

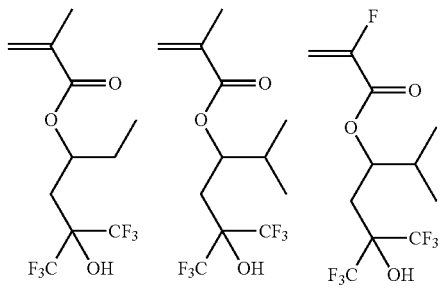

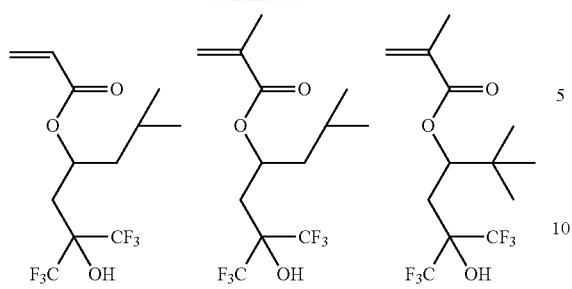
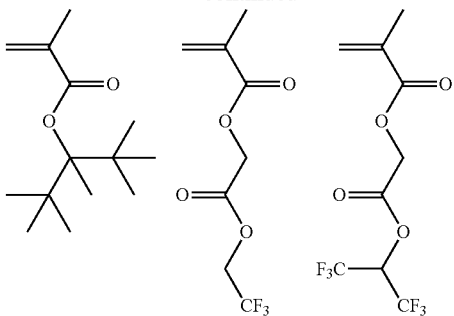
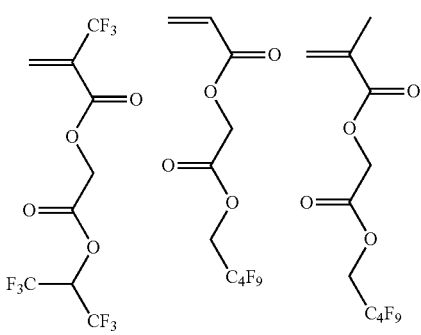
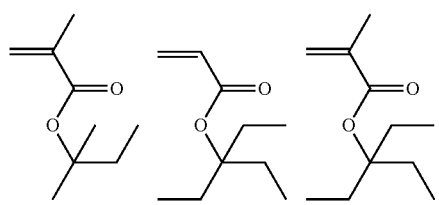
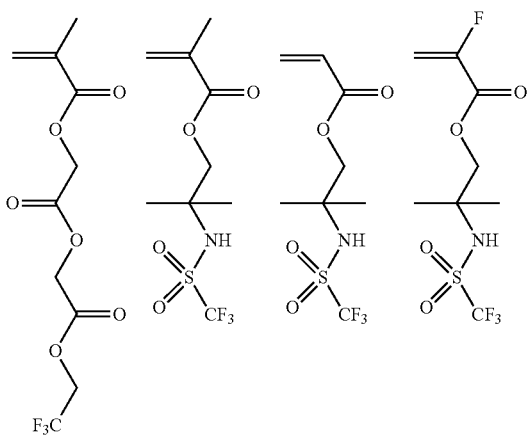
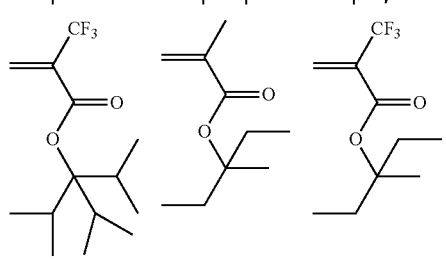
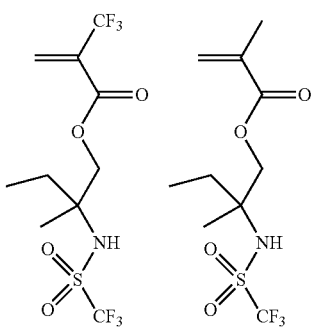

-continued
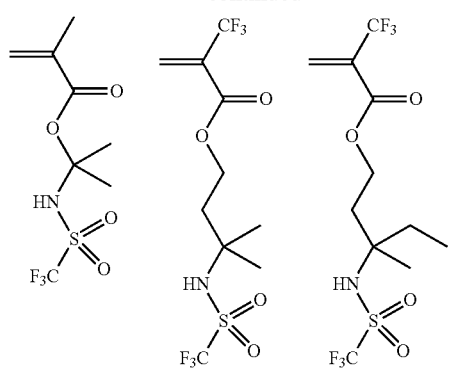
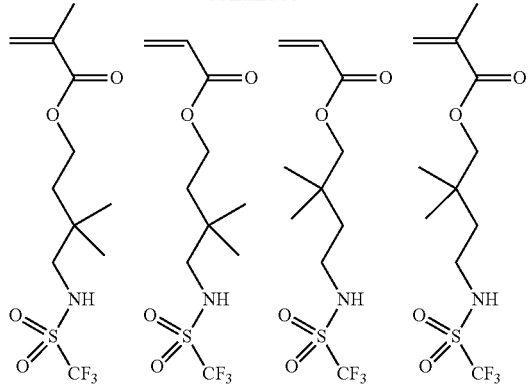
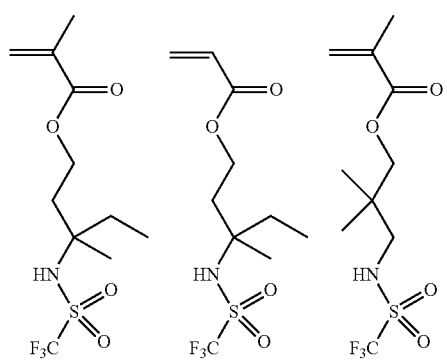
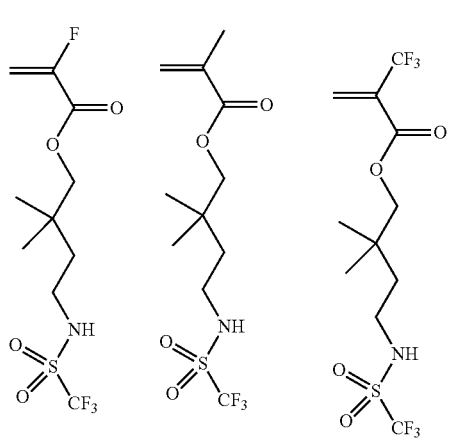
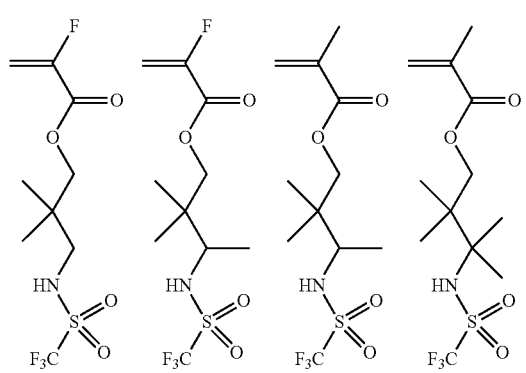
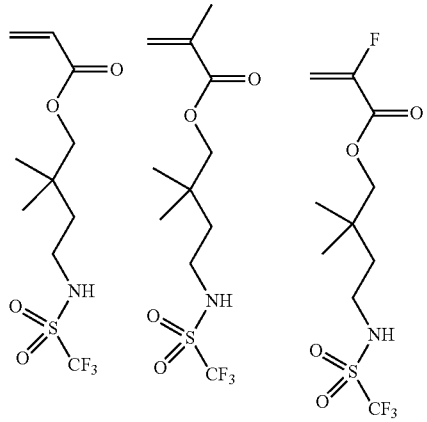
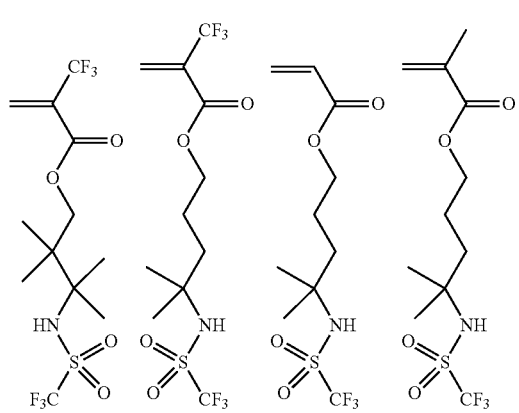
Exemplary polymers useful as the surface active polymer include, for example, the following:

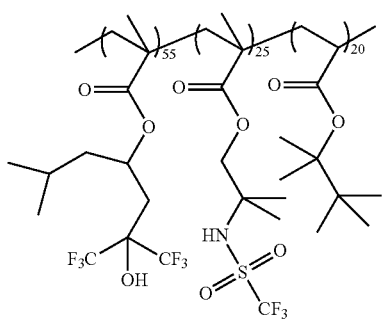
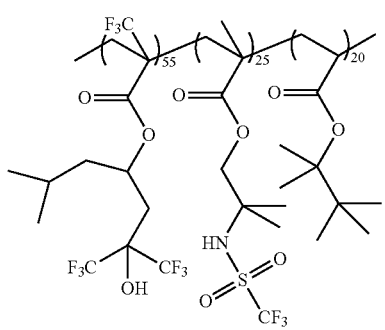
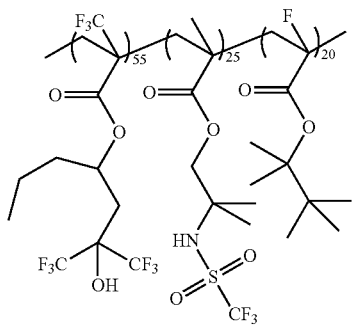
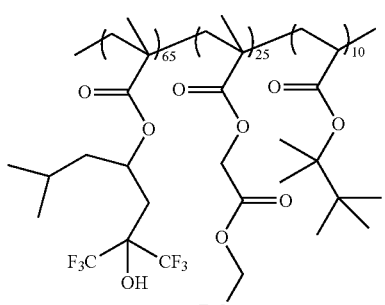
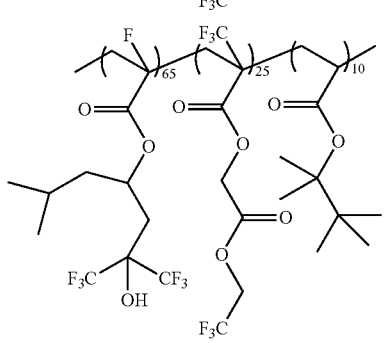
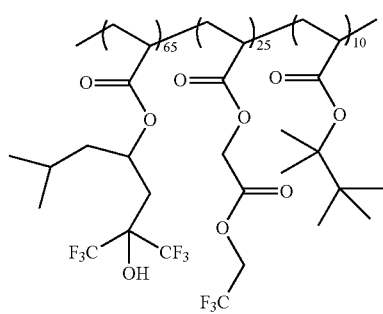
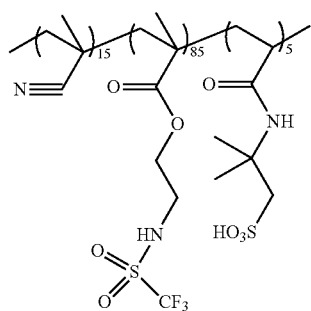
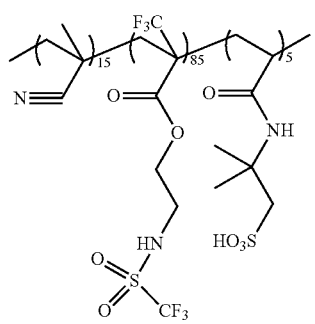
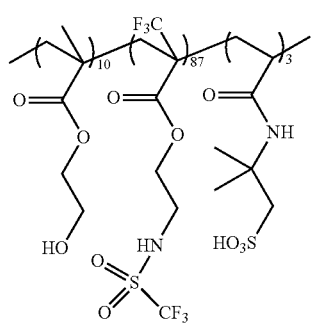
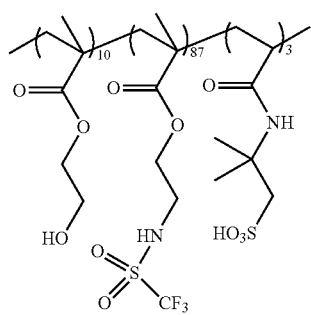

-continued
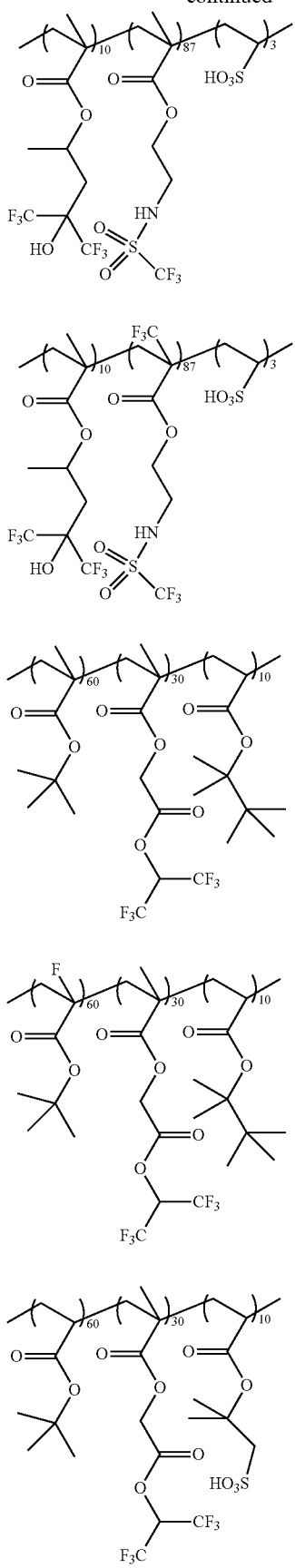
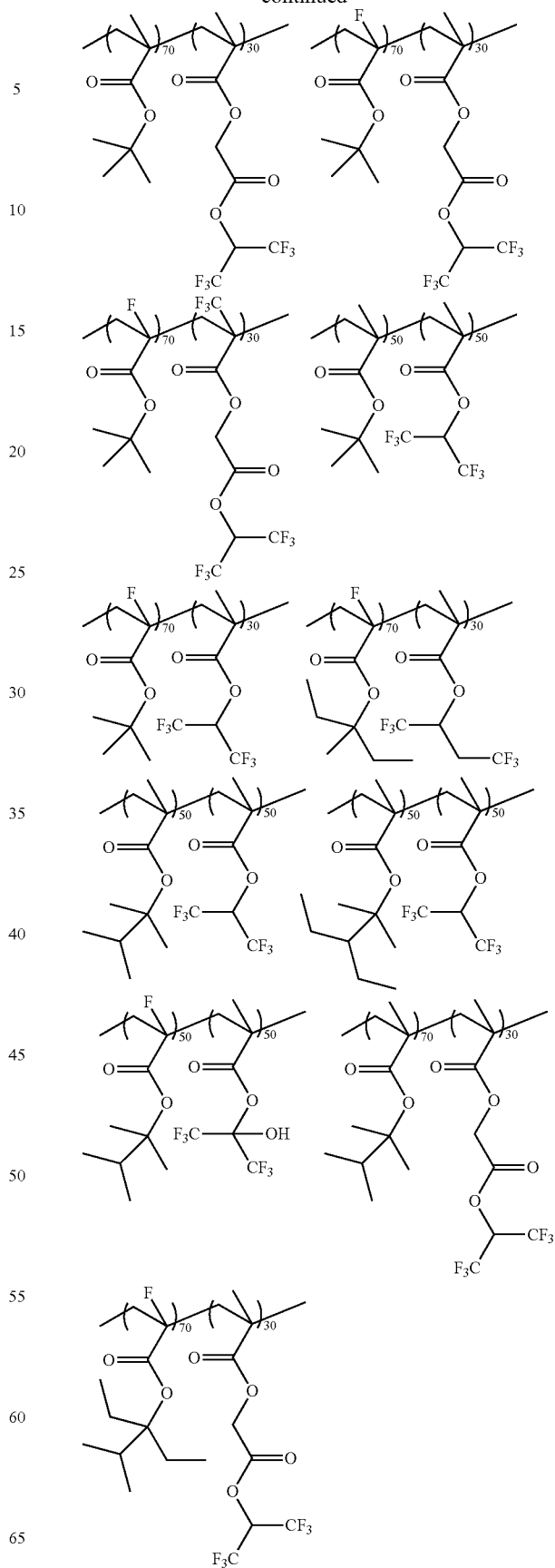

-continued

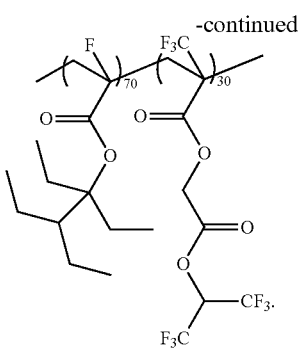

The surface active polymer lower limit for immersion lithography is generally dictated by the need to prevent leaching of the photoresist components. The surface active polymer is typically present in the compositions in an amount of from 1 to 30 wt %, more typically from 3 to 20 wt % or 5 to 15 wt %, based on total solids of the topcoat composition. The weight average molecular weight Mw of the additive polymer is typically less than 400,000, preferably from 5000 to 50,000, more preferably from 5000 to 25,000 Daltons.

Optionally, one or more additional polymers can be used in the topcoat compositions, for example, to further tune one or more characteristic of the topcoat layer.

The topcoat compositions further include an ionic thermal acid generator comprising an anion and a cation, wherein the anion, the cation, or the anion and the cation are fluorinated. Use of an ionic TAG compound as described herein may provide improvements in pattern collapse properties as compared with topcoat compositions lacking such a compound or other acid source. The TAG, when heated at or above its activation temperature, generates the corresponding conjugate acid. In the case of a positive-acting photoresist composition, the generated acid is believed to provide thickness loss to the generated photoresist pattern in unexposed regions at the surface of the photoresist layer due to acid-catalyzed deprotection reaction in those regions. Such thickness loss is believed to improve (lessen) the occurrence of pattern collapse defects. Use of an ionic TAG is further believed to improve shelf life stability of the topcoat compositions as compared with use of a free acid in the compositions.

Preferably, the thermal acid generator is a salt of a sulfonic acid such as an aromatic or an aliphatic sulfonic acid. The generated aliphatic sulfonic acids can be, for example, linear, branched or cyclic (monocyclic or polycyclic, e.g., camphor or adamantyl). Preferably the sulfonic acid comprises one or more fluorine atoms and/or fluorinated alcohol groups on the anion and/or cation. The ionic thermal acid generators typically produce an acid having a pKa from −14 to 2.0, more typically from −3.0 to 2.0. Fluorination of the TAG can take the form, for example, of a fluorinated alkylene, alkyl, arylene or aryl group and/or as a fluorinated alcohol group. These fluorinated group can be partially fluorinated or completely fluorinated, i.e., perfluorinated. Preferred fluorinated alcohol groups include a fluorine atom and/or a pendant fluorinated group such as partially or completely fluorinated alkyl, typically methyl, ethyl or propyl, bonded to a carbon at the alpha position of the alcohol hydroxyl. Particularly preferred are fluoroalcohol groups of the formula —C(CF$_3$)$_2$OH. Typically, the generated acid includes a plurality of fluorinated alcohol groups and/or one or more other type of group, for example, carboxyl, hydroxyl, nitro, cyano, C1-5 alkoxy, formyl, esters, optionally substituted alkyl, C5 or higher monocyclic, polycyclic, fused polycyclic cycloaliphatic, or aryl, which may optionally comprise a heteroatom.

Particularly suitable thermal acid generators include, for example, those of the following general formula (I):

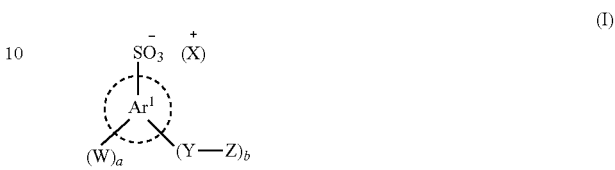

wherein: Ar$^1$ represents an optionally substituted carbocyclic or heterocyclic aromatic group. Ar$^1$ may, for example, include a single aromatic ring such as phenyl or pyridyl; an aromatic ring substituted with another aromatic group such as biphenyl; fused aromatic rings such as naphthyl, anthracenyl, pyrenyl or quinolinyl; or fused ring systems having both aromatic and non-aromatic rings such as 1,2,3,4-tetrahydronaphthalene, 9,10-dihydroanthracene, or fluorene. Optionally, the aromatic group may be substituted. The aromatic group can, for example, have one or more of its hydrogen atoms replaced with one or more substituent such as C$_{1-30}$ alkyl, C$_{2-30}$ alkenyl, C$_{7-30}$ aralkyl, C$_{6-30}$ aryl, —OR$^1$, —C$_{1-30}$ alkylene-OR$^1$, and —C$_{1-30}$ alkylidene-OR$^1$; wherein R$^1$ is selected from H, C$_{1-30}$ alkyl, C$_{2-30}$ alkenyl, and C$_{6-30}$ aryl. A wide variety of aromatic groups may be used for Ar$^1$, which may be unsubstituted or substituted. Such unsubstituted aromatic groups may have from 5 to 40 carbons, preferably from 6 to 35 carbons, and more preferably from 6 to 30 carbons. Suitable aromatic groups include, but are not limited to: phenyl, biphenyl, naphthalenyl, anthracenyl, phenanthrenyl, pyrenyl, tetracenyl, triphenylenyl, tetraphenyl, benzo[f]tetraphenyl, benzo[m]tetraphenyl, benzo[k]tetraphenyl, pentacenyl, perylenyl, benzo[a]pyrenyl, benzo[e]pyrenyl, benzo[ghi]perylenyl, coronenyl, quinolonyl, 7,8-benzoquinolinyl, fluorenyl, and 12H-dibenzo[b,h]fluorenyl, each of which may by unsubstituted or substituted; W independently represents a group chosen from carboxyl, hydroxy, nitro, cyano, C1-5 alkoxy and formyl; X is a cation as described below; Y independently represents a linking group chosen, for example, from sulfur, optionally substituted amino groups, amides, ethers, carbonyl esters, sulfonyl esters, sulfones, sulfonamides and divalent hydrocarbon group, for example, C1-20 straight chain, branched or cyclic optionally substituted hydrocarbon groups, and combinations thereof; Z independently represents a group chosen from hydroxyl, fluoroalkyl, fluorinated alcohols, esters, optionally substituted alkyl, C5 or higher optionally substituted monocyclic, polycyclic, fused polycyclic cycloaliphatic, or aryl, which may optionally comprise a heteroatom, provided at least one occurrence of Z is fluoroalkyl or a fluorinated alcohol group; a is an integer of 0 or greater, typically 0 to 2; b is an integer of 1 or greater, typically 1 or 2; provided that a+b is at least 1 and not greater than the total number of available aromatic carbon atoms of the aromatic group, with a+b of from 2 to 5 being typical, more typically 2 or 3. Preferably, a fluorinated alcohol group is bonded to the aromatic ring of the anion through an ester group. More preferably, a plurality of fluorinated alcohol groups are present and bonded to the aromatic ring through a respective ester group.
Suitable exemplary thermal acid generator anions include, without limitation, the following: Suitable thermal acid generators include, for example, the following:
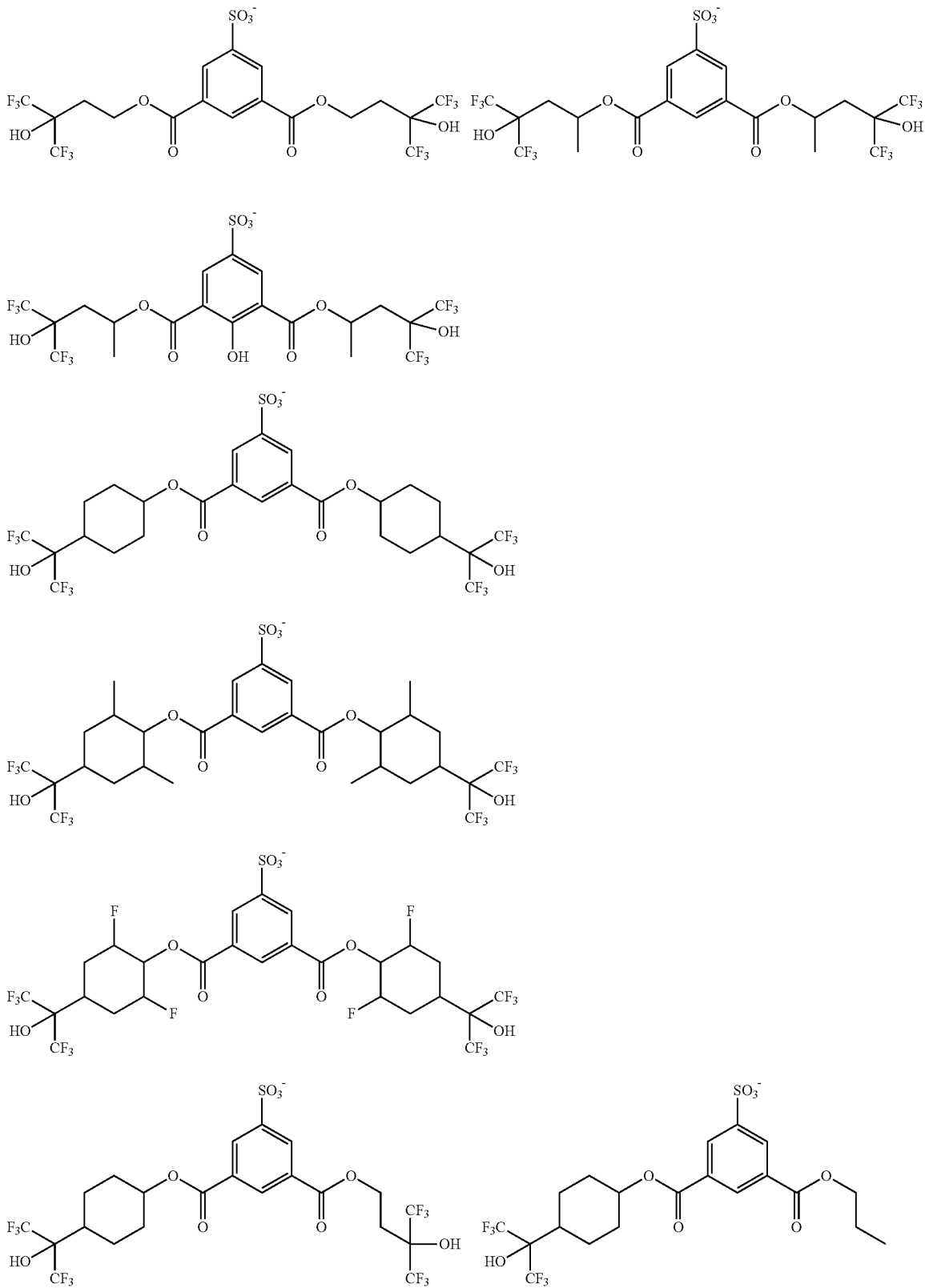

-continued
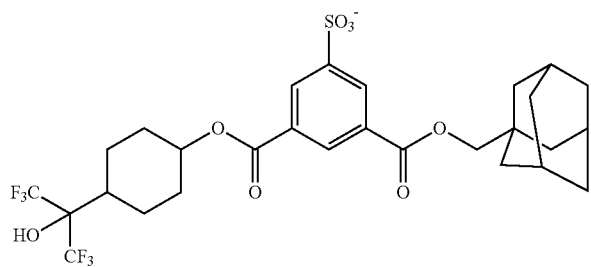
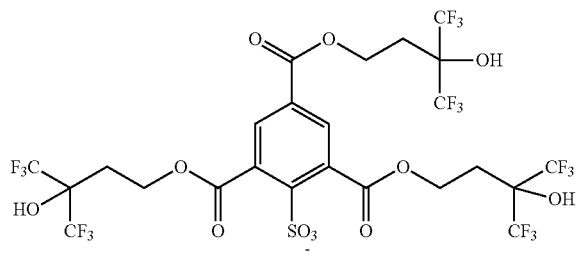
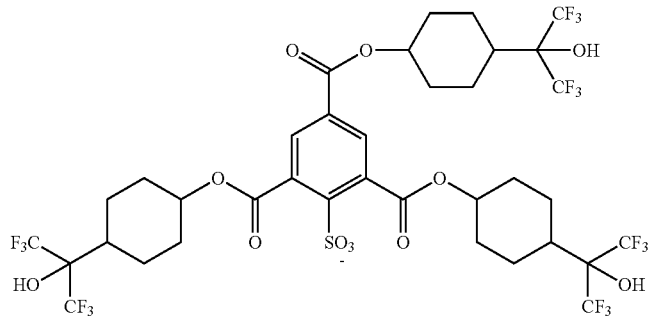
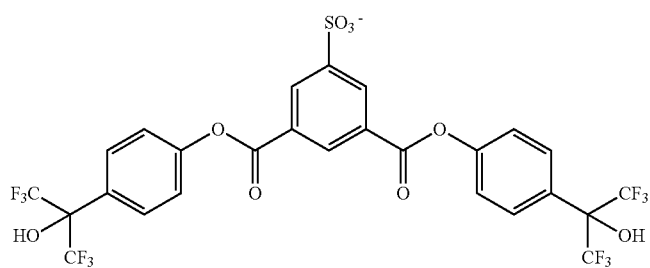
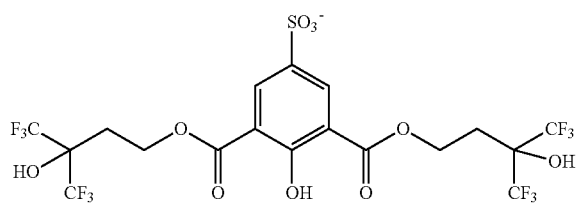
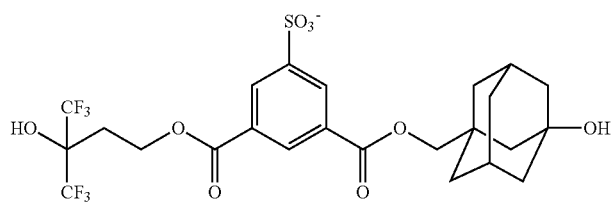

-continued
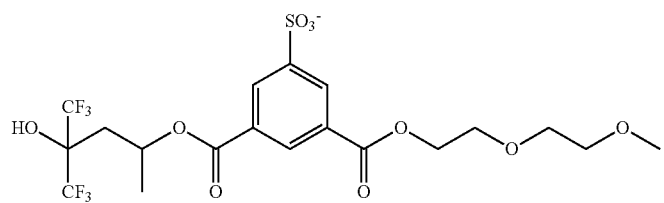
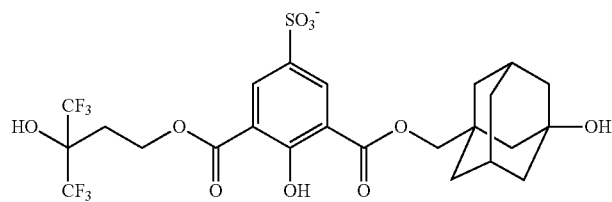
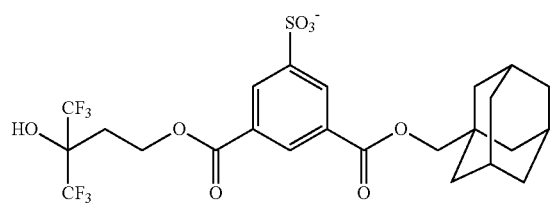
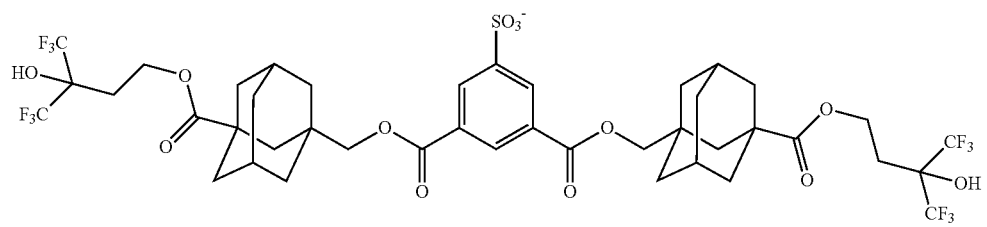
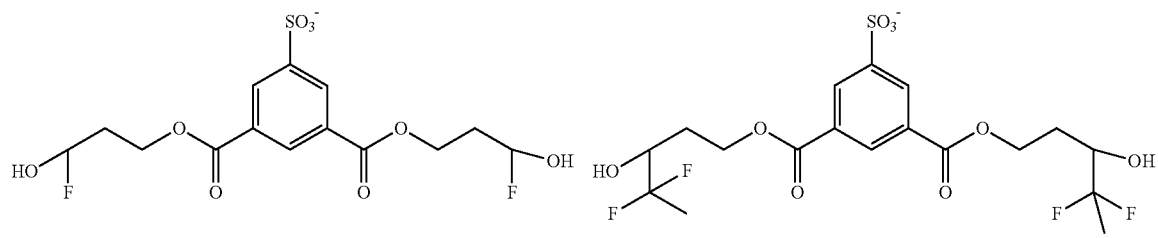
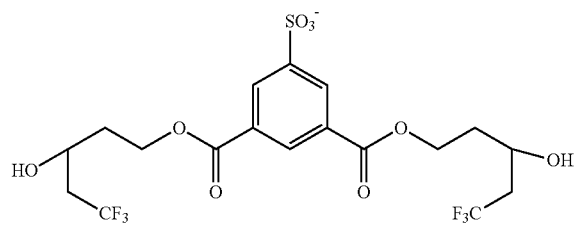
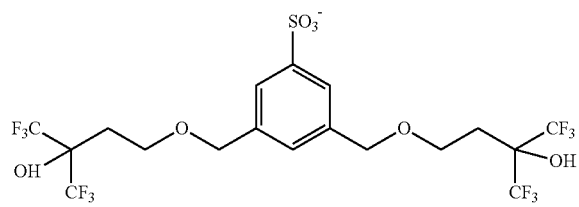

-continued
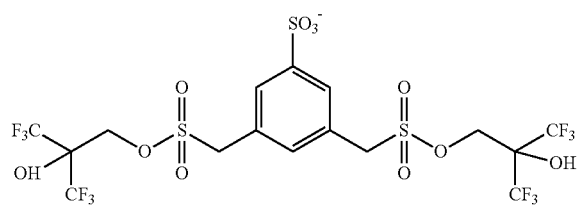
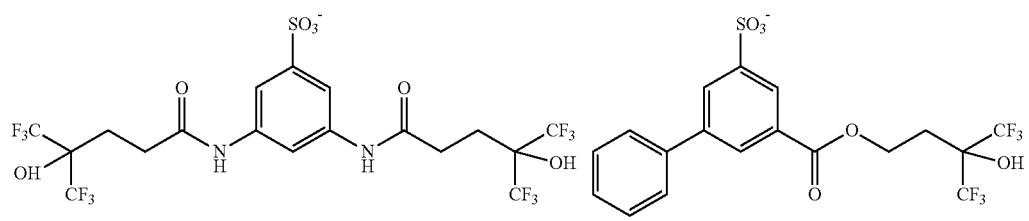
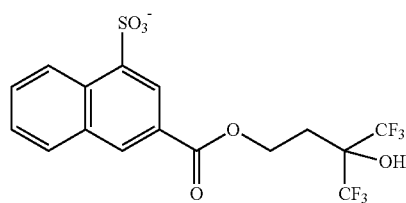
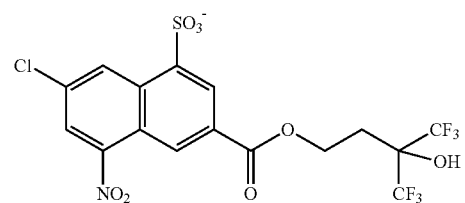
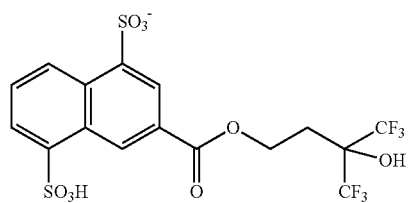
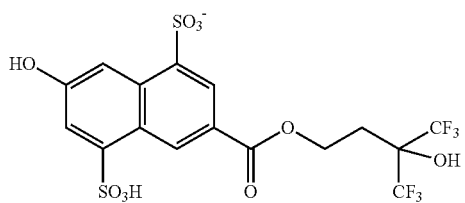
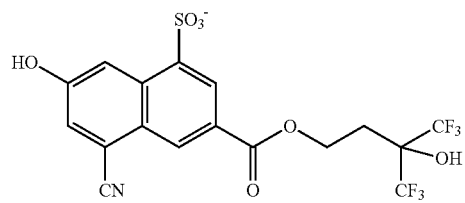
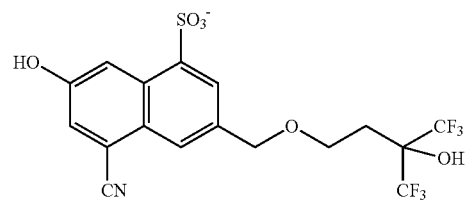
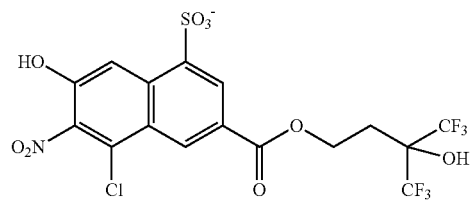
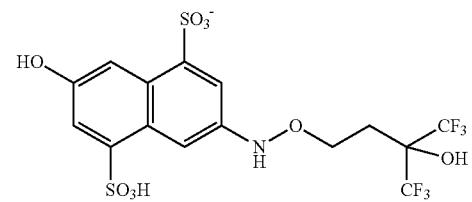
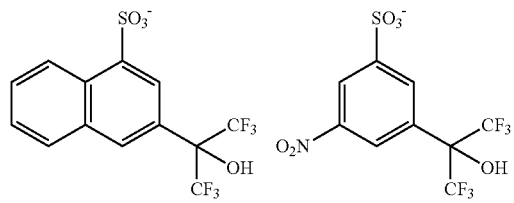
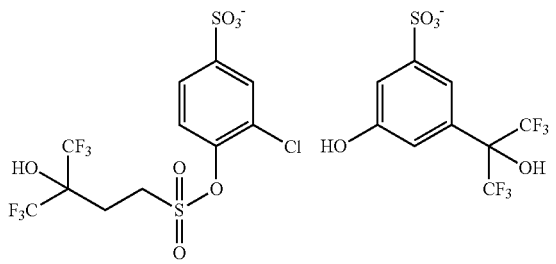

-continued
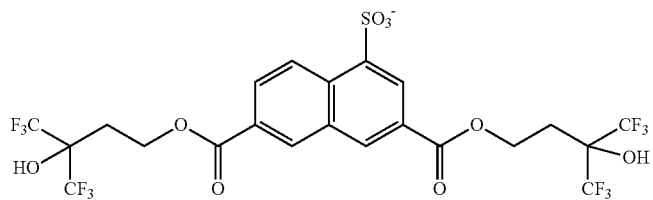
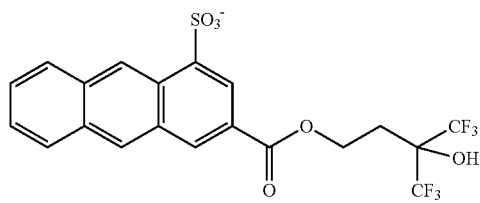
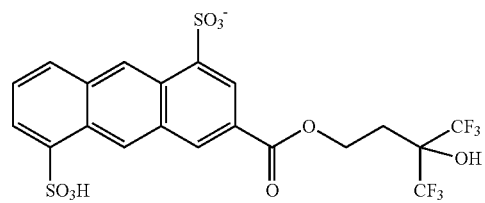
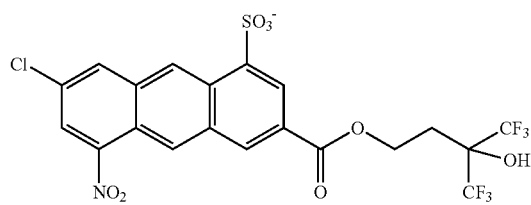
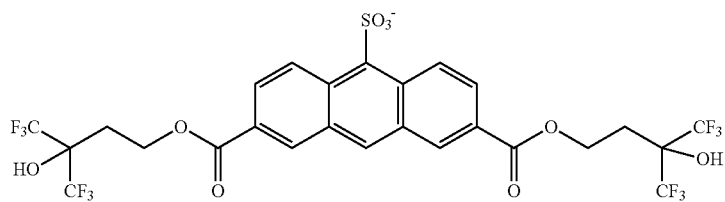
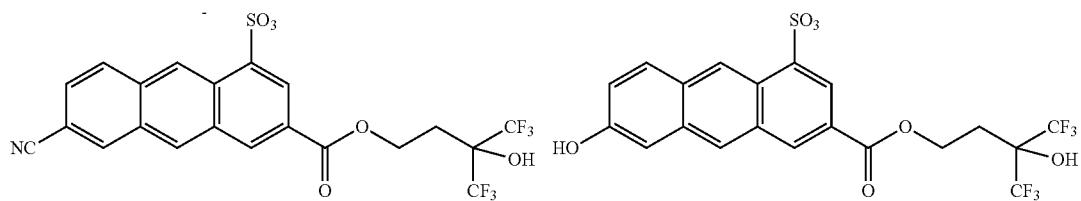
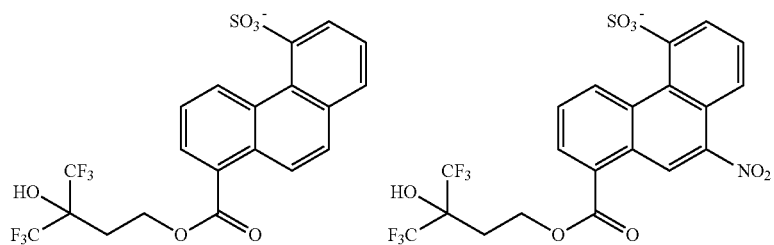
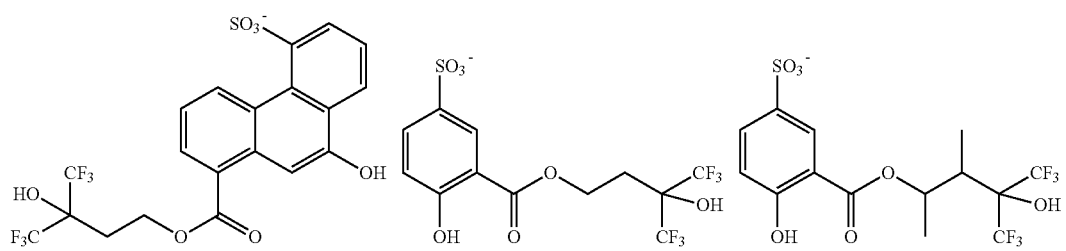

-continued
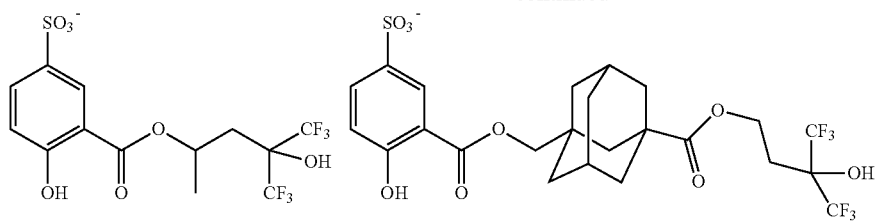
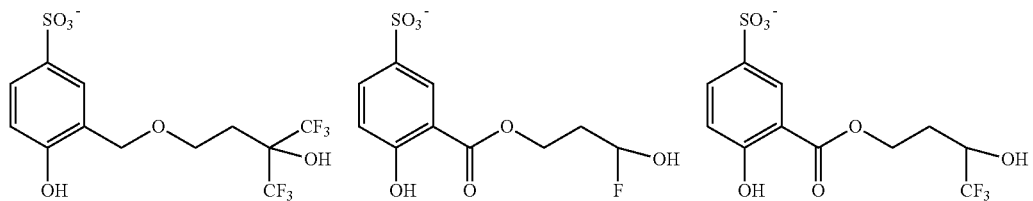
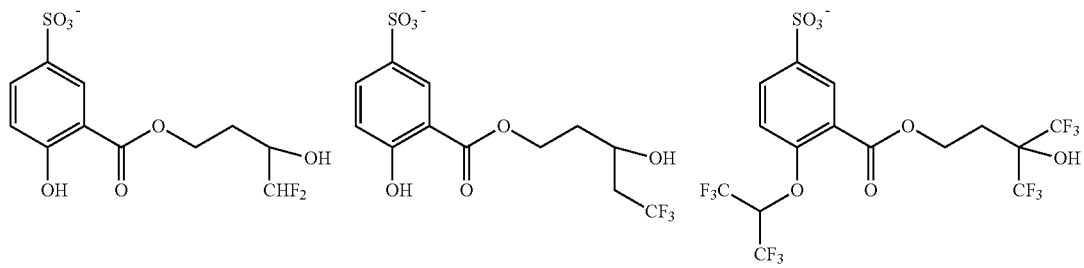
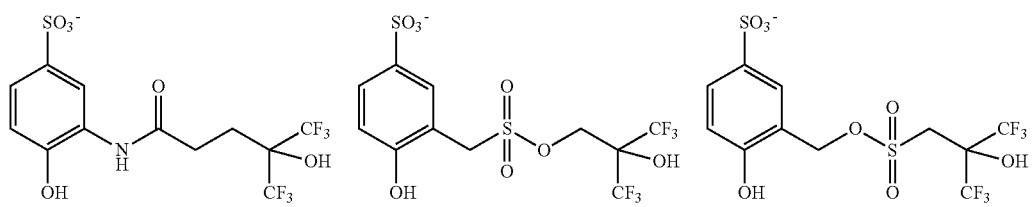
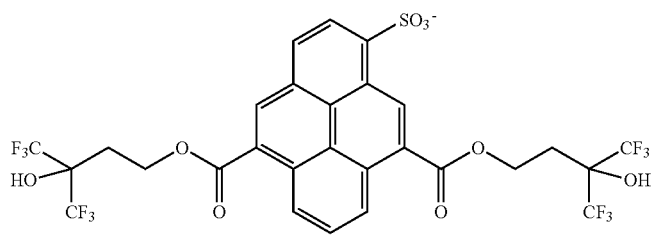
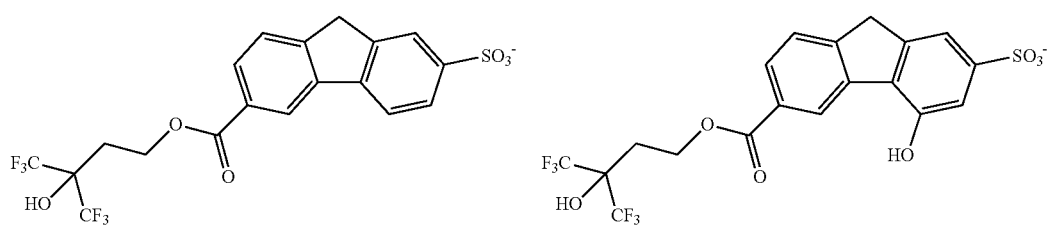

-continued
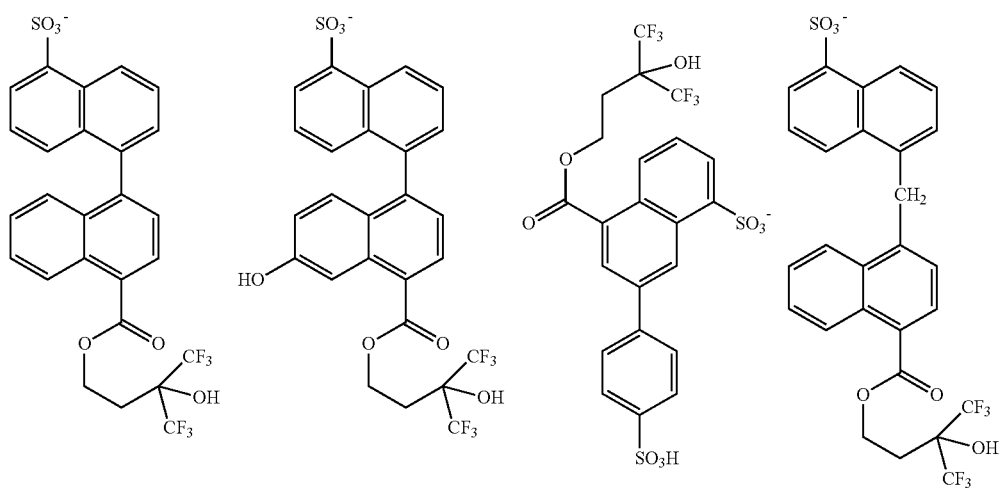
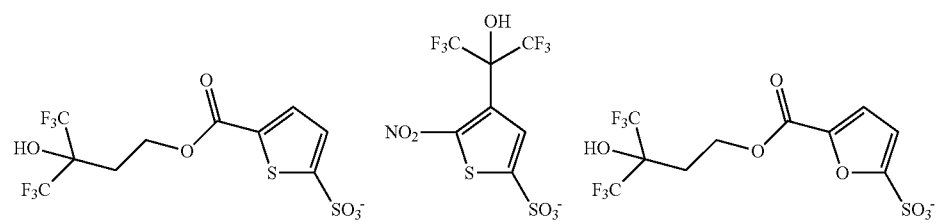
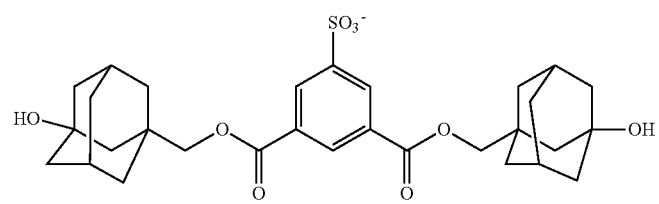
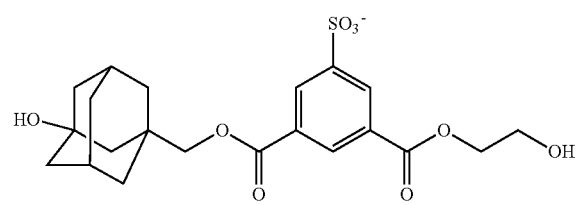
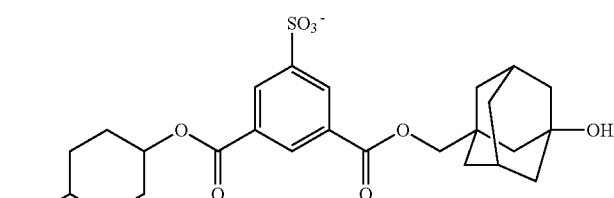
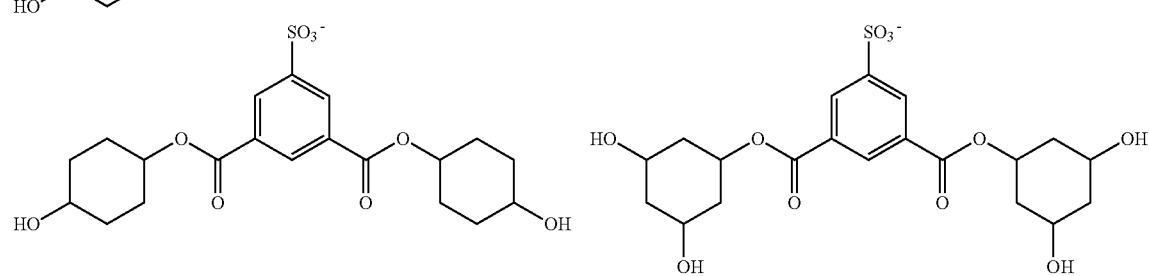

-continued
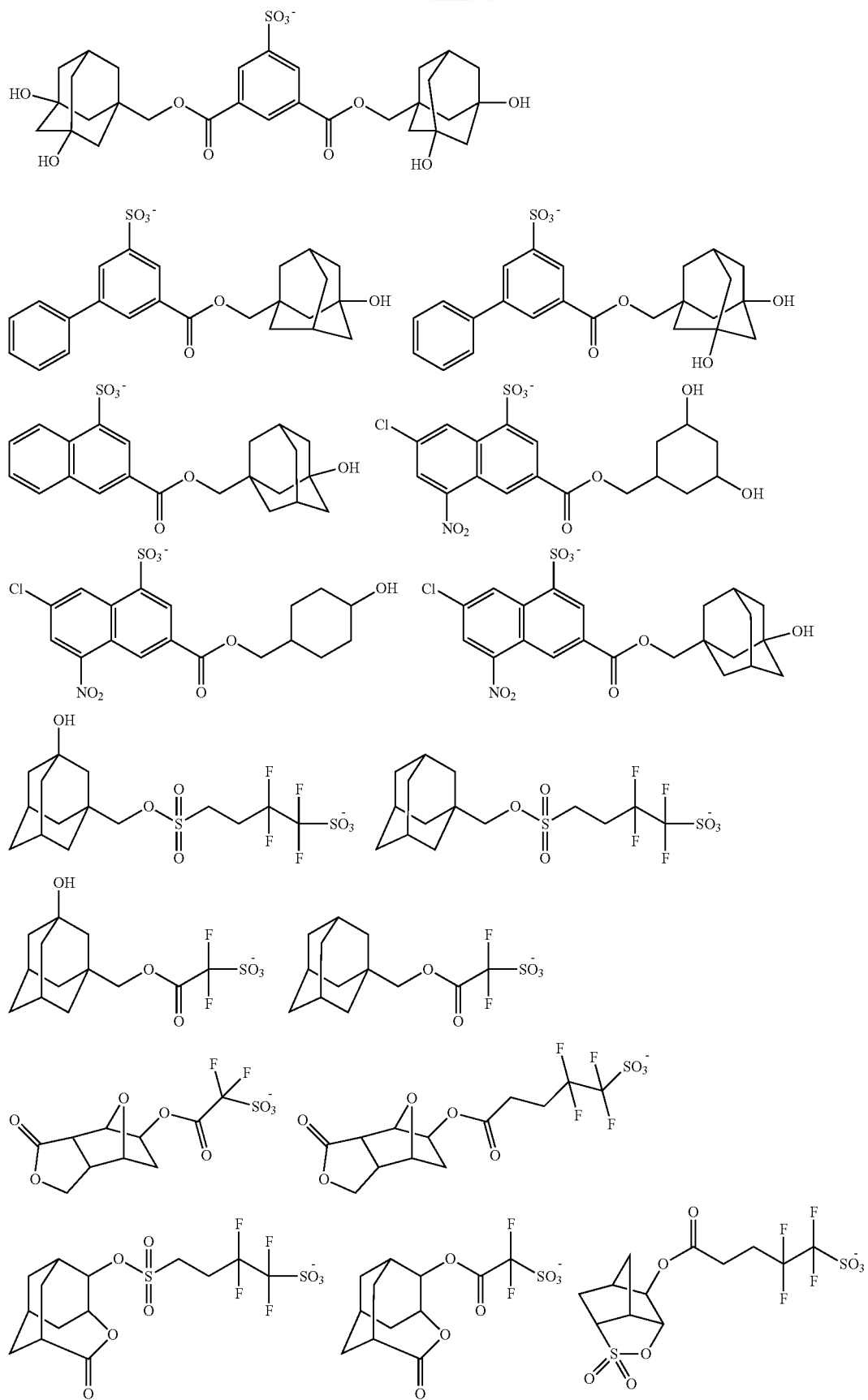

-continued
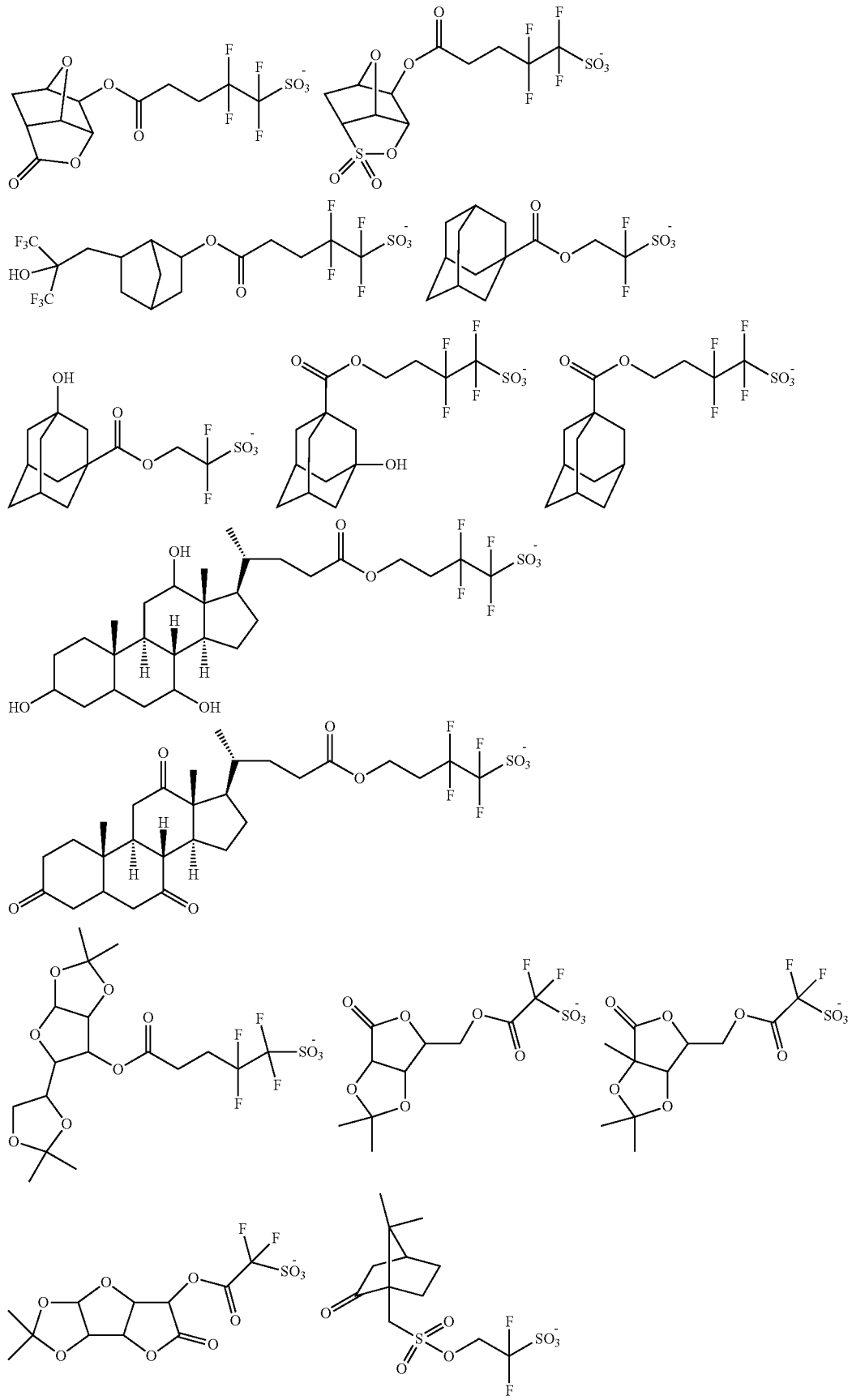

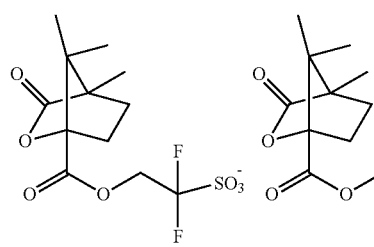
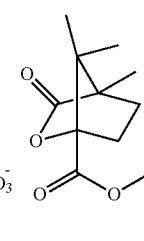
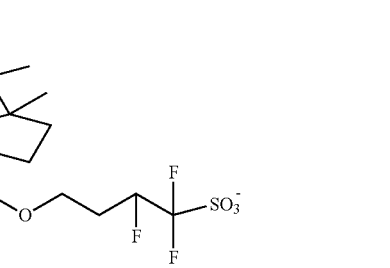
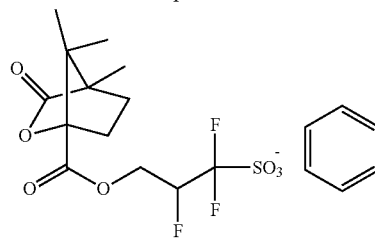
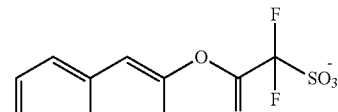
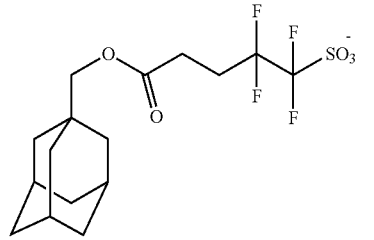
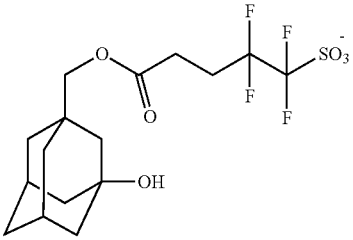
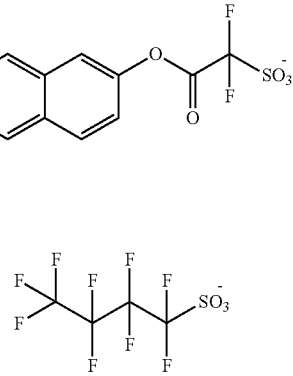
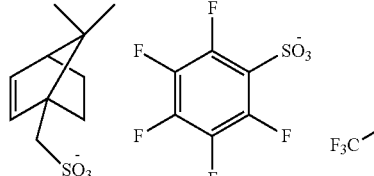
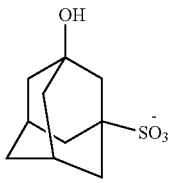
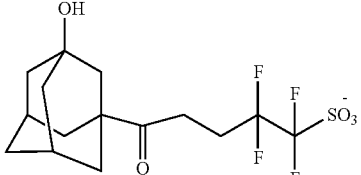
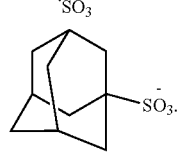

The thermal acid generator cation is preferably an organic cation. Preferably, the cation is a nitrogen-containing cation of the general formula (I):

(BH)⁺          (I)

which is the monoprotonated form of a nitrogen-containing base B. Suitable nitrogen-containing bases B include, for example: optionally substituted amines such as ammonia, difluoromethylammonia, C1-20 alkyl amines, and C3-30 aryl amines, for example, nitrogen-containing heteroaromatic bases such as pyridine or substituted pyridine (e.g., 3-fluoropyridine), pyrimidine and pyrazine; nitrogen-containing heterocyclic groups, for example, oxazole, oxazoline, or thiazoline. The nitrogen-containing base B can be optionally substituted, for example, with one or more group chosen from alkyl, aryl, halogen atom (preferably fluorine), cyano, nitro and alkoxy. Of these, base B is preferably a heteroaromatic base.

Base B typically has a pKa from 0 to 5.0, between 0 and 4.0, between 0 and 3.0, or between 1.0 and 3.0. As used herein, the term "pK$_a$" is used in accordance with its art-recognized meaning. That is, pK$_a$ is the negative log (to the base 10) of the dissociation constant of the conjugate acid (BH)⁺ of the basic moiety (B) in aqueous solution at about room temperature. In certain embodiments, base B has a boiling point less than about 170° C., or less than about 160° C., 150° C., 140° C., 130° C., 120° C., 110° C., 100° C. or 90° C.

Exemplary suitable nitrogen-containing cations (BH)⁺ include $NH_4^+$, $CF_2HNH_2^+$, $CF_3CH_2NH_3^+$, $(CH_3)_3NH^+$, $(C_2H_5)_3NH^+$, $(CH_3)_2(C_2H_5)NH^+$ and the following:

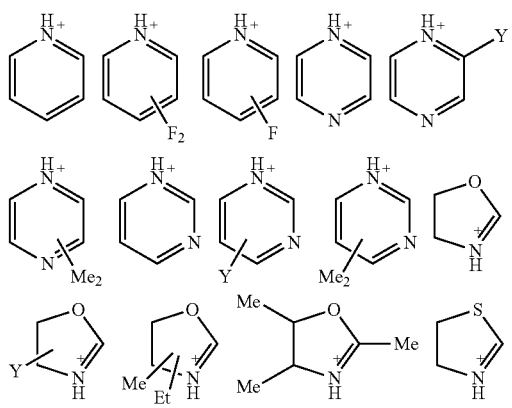

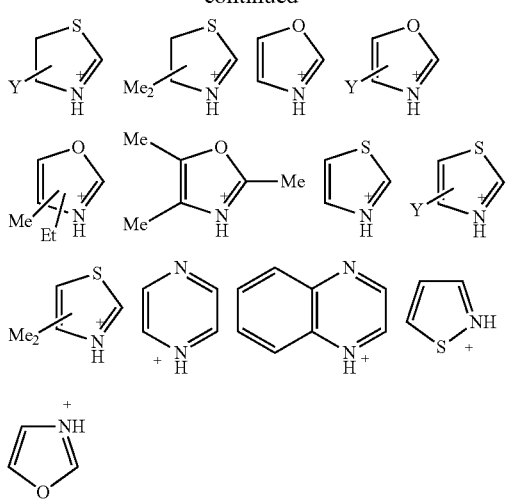

in which Y is alkyl, preferably, methyl or ethyl.

Other suitable cations include onium cations. Suitable onium cations include, for example, sulfonium and iodonium cations, for example, those of the following general formula (II):

 (II)

wherein X is S or I, wherein when X is I then a is 2, and when X is S then a is 3; $R^3$ is independently chosen from organic groups such as optionally substituted $C_{1-30}$ alkyl, polycyclic or monocyclic $C_{3-30}$ cycloalkyl, polycyclic or monocyclic $C_{6-30}$ aryl, or a combination thereof, wherein when X is S, two of the $R^3$ groups together optionally form a ring.

Exemplary suitable sulfonium and iodonium cations include the following:

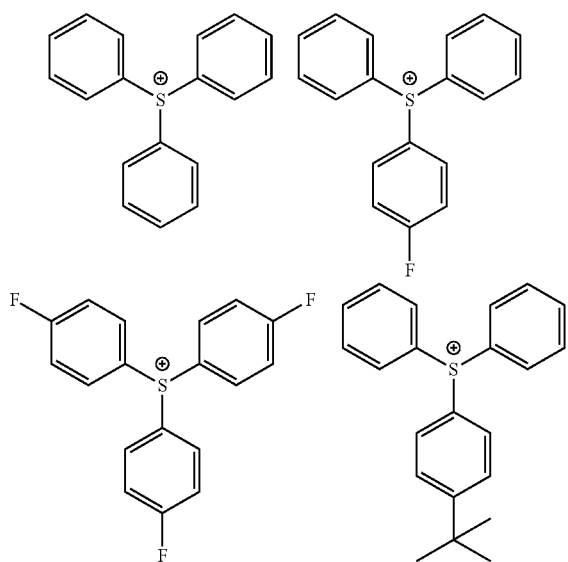

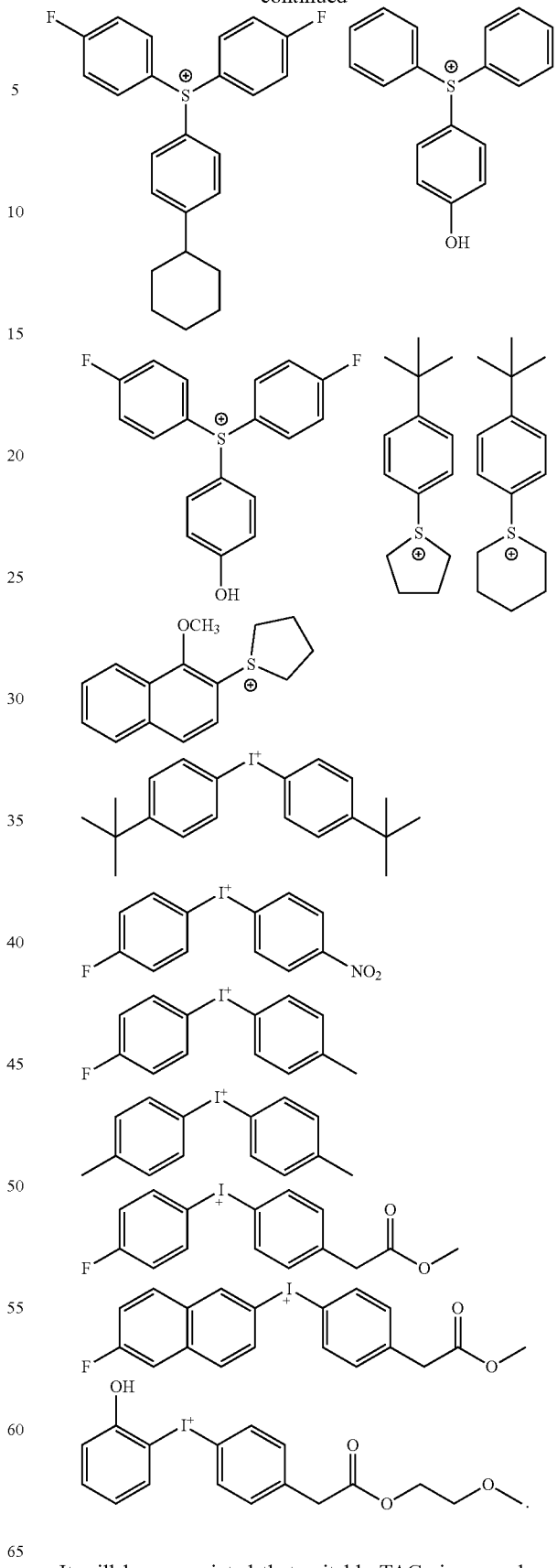

It will be appreciated that suitable TAGs in accordance with the invention can include combinations of the described anions with the described cations. Exemplary suitable TAGs include, without limitation, the following:
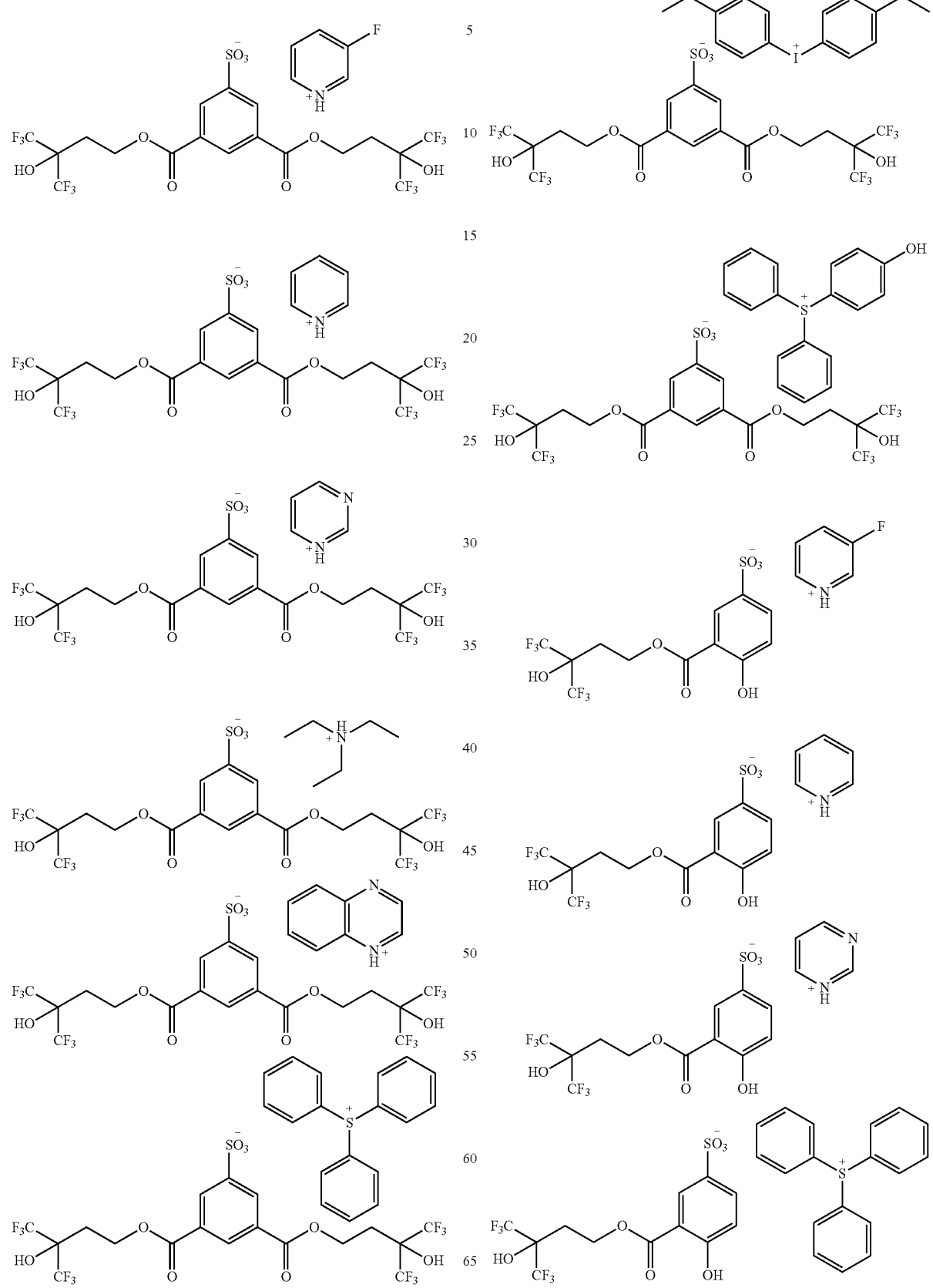

-continued

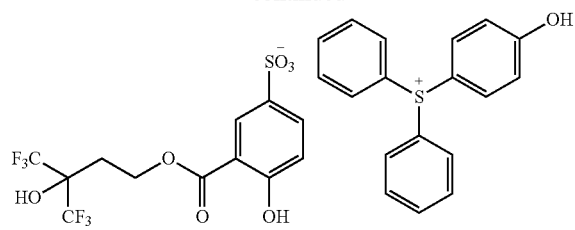
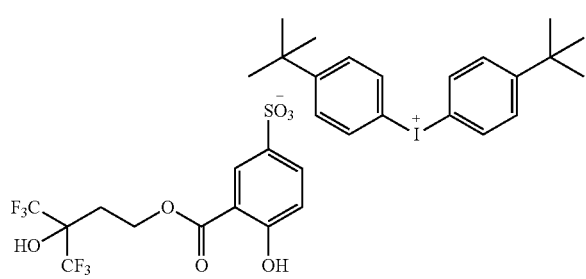
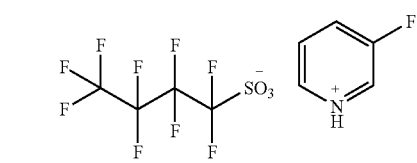
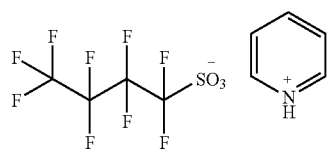
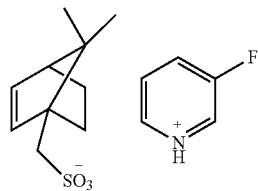
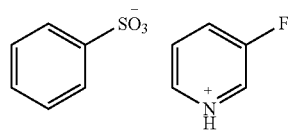
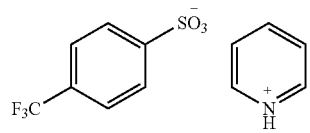
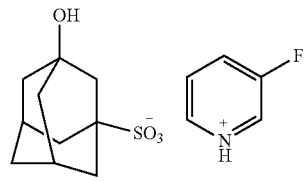
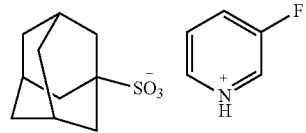

-continued

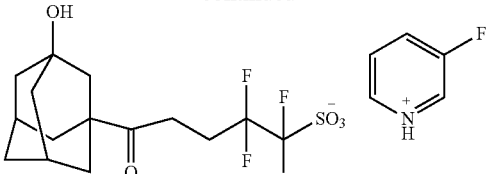
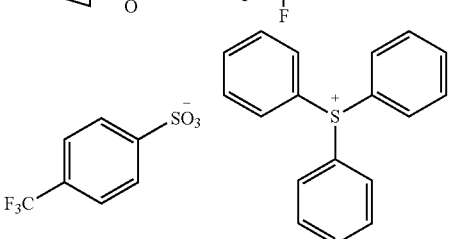
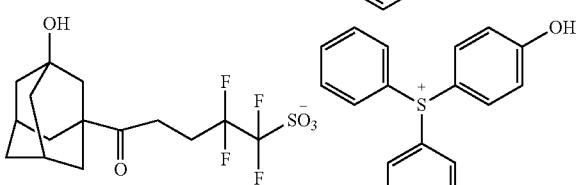
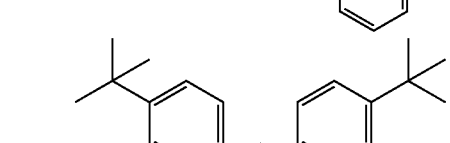
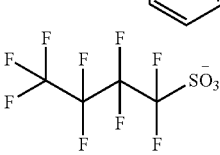

The TAGs typically have a weight average molecular weight Mw of from 300 to 2500, more typically from 500 to 1500. The thermal acid generator can typically be activated at a bake temperature of 100° C. or less, such as from 110 to 100° C., for example, from 80 to 90° C. or from 70 to 80° C. The thermal acid generator is typically present in the compositions in an amount of from 0.01 to 20 wt %, more typically from 0.1 to 10 wt % or from 1 to 5 wt %, based on total solids of the topcoat composition.

Suitable thermal acid generators in accordance with the invention can be made by persons skilled in the art using known techniques and commercially available starting materials. For example, preferred thermal acid generators can be made by stirring a solution of free acid with an amine in a solvent, typically for a few hours. TAGs having a sulfonium or iodonium cation can be generated by mixing together a salt of the aromatic sulfonate anion with a salt of the sulfonium or iodonium cation in a solvent, typically for a few hours.

Typical solvent materials to formulate and cast a topcoat are any which dissolve or disperse the components of the topcoat composition but do not appreciably dissolve an underlying photoresist layer. More particularly, suitable solvents to formulate a topcoat composition include one or more of, but are not limited to, alcohols such as n-butanol, alkylene glycols, such as propylene glycol. Additionally or alternatively, non-polar solvents such as aliphatic and aromatic hydrocarbons, and alkyl ethers such as dodecane, isooctane and isopentyl ether may be used. Preferably, a mixture of different solvents, for example, two, three or more solvents, can be used to achieve effective phase separation of the segregating, first additive polymer from other polymer(s) in the composition and to reduce the viscosity of the formulation which allows for reduction in the dispense volume.

In an exemplary aspect, a two-solvent system or a three-solvent system can be used in the topcoat compositions of the invention. The solvent system can include, for example, a primary solvent and an additive solvent and may include a thinner solvent. The primary solvent typically exhibits excellent solubility characteristics with respect to the non-solvent components of the topcoat composition. While the desired boiling point of the primary solvent will depend on the other components of the solvent system, the boiling point is typically less than that of the additive solvent, with a boiling point of from 120 to 140° C. such as about 130° C. being typical. Suitable primary solvents include, for example, C4 to C8 n-alcohols, such as n-butanol, isobutanol, 2-methyl-1-butanol, isopentanol, 2,3-dimethyl-1-butanol, 4-methyl-2-pentanol, isohexanol and isoheptanol, isomers thereof and mixtures thereof. The primary solvent is typically present in an amount of from 30 to 80 wt % based on the solvent system.

The additive solvent is present to facilitate phase separation between the surface active polymer and other polymer(s) in the topcoat composition to facilitate a self-segregating topcoat structure. In addition, the higher boiling point additive solvent can reduce the tip drying effect during coating. It is typical for the additive solvent to have a higher boiling point than the other components of the solvent system. While the desired boiling point of the additive solvent will depend on the other components of the solvent system, a boiling point of from 170 to 200° C. such as about 190° C. is typical. Suitable additive solvents include, for example, hydroxy alkyl ethers. Exemplary hydroxy alkyl ethers include dialkyl glycol mono-alkyl ethers and isomers thereof, for example, diethylene glycol monomethyl ether, dipropylene glycol monomethyl ether, isomers thereof and mixtures thereof. The additive solvent is typically present in an amount of from 3 to 15 wt % based on the solvent system.

A thinner solvent can optionally be used to lower the viscosity and improve coating coverage at a lower dispensing volume. The thinner solvent is typically a poorer solvent for the non-solvent components of the composition relative to the primary solvent. While the desired boiling point of the thinner solvent will depend on the other components of the solvent system, a boiling point of from 140 to 180° C. such as about 170° C. is typical. Suitable thinner solvents include, for example, alkanes such as C8 to C12 n-alkanes, for example, n-octane, n-decane and dodecane, isomers thereof and mixtures of isomers thereof; and/or alkyl ethers such as those of the formula $R_1$—O—$R_2$, wherein $R_1$ and $R_2$ are independently chosen from $C_2$ to $C_8$ alkyl, $C_2$ to $C_6$ alkyl and $C_2$ to $C_4$ alkyl. The alkyl ether groups can be linear or branched, and symmetric or asymmetric. Particularly suitable alkyl ethers include, for example, isobutyl ether, isopentyl and isobutyl isohexyl, isomers thereof and mixtures thereof. Other suitable thinner solvents include, for example, propyl pentanoate, isopropyl pentanoate, isopropyl 3-methylbutanoate, isopropyl 2-methylbutanoate, isopropyl pivalate, isobutyl isobutyrate, 2-methylbutyl isobutyrate, 2-methylbutyl 2-methylbutanoate, 2-methylbutyl 2-methylhexanoate, 2-methylbutyl heptanoate, hexyl heptanoate, n-butyl n-butyrate, isoamyl n-butyrate and isoamyl isovalerate. The thinner solvent if used is typically present in an amount of from 10 to 70 wt % based on the solvent system.

Particularly suitable three-solvent systems include 4-methyl-2-pentanol/isopentyl ether/dipropylene glycol monomethyl ether and 4-methyl-2-pentanol/isobutyl isobutyrate/ dipropyleneglycol methyl ether. One or more additional solvents may be used in the solvent system, for example, one or more additional primary solvent, thinner solvent, additive solvent and/or other solvent may be employed.

The topcoat compositions of the invention may comprise one or more other optional components, for example, a photoacid generator (PAG) compound. Suitable photoacid generators are known in the art of chemically amplified photoresists and include, for example: onium salts, for example, triphenylsulfonium trifluoromethanesulfonate, (p-tert-butoxyphenyl)diphenylsulfonium trifluoromethanesulfonate, tris(p-tert-butoxyphenyl)sulfonium trifluoromethanesulfonate, triphenylsulfonium p-toluenesulfonate; diazomethane derivatives, for example, bis(benzenesulfonyl)diazomethane, bis(p-toluenesulfonyl)diazomethane; glyoxime derivatives, for example, bis-O-(p-toluenesulfonyl)-α-dimethylglyoxime, and bis-O-(n-butanesulfonyl)-α-dimethylglyoxime; sulfonic acid ester derivatives of an N-hydroxyimide compound, for example, N-hydroxysuccinimide methanesulfonic acid ester, N-hydroxysuccinimide trifluoromethanesulfonic acid ester; and halogen-containing triazine compounds, for example, 2-(4-methoxyphenyl)-4,6-bis(trichloromethyl)-1,3,5-triazine, and 2-(4-methoxynaphthyl)-4,6-bis(trichloromethyl)-1,3,5-triazine. One or more of such PAGs can be used. The one or more photoacid generator may be utilized in relatively small amounts in a topcoat composition, for example, 0.1 to 8 wt %, such as about 2 wt %, based on total solids of the composition. Such use of one or more photoacid generator compounds may favorably impact lithographic performance, particularly resolution, of the developed image patterned in an underlying resist layer. The topcoat compositions can alternatively be free of photoacid generators.

When used in immersion lithography, preferred topcoat layer compositions will have a refractive index between that of the immersion fluid and that of the photoresist at the target exposure wavelength. Preferred topcoat composition layers typically have an index of refraction of 1.4 or greater, preferably 1.47 or greater, at 193 nm. For any particular system, the index of refraction can be tuned by changing the composition of one or more polymers of the topcoat composition, including by altering the ratio of components of a polymer blend, or composition of any of the polymer(s) of a topcoat composition. For instance, increasing the amount of organic content in a topcoat layer composition can provided increased refractive index of the layer.

The topcoat compositions of the invention may be suitably prepared by admixture of the polymers and optional components into one or more polar solvents such as those identified above or alternatively one or more non-polar solvents such as the aliphatic and aromatic hydrocarbons identified above. The viscosity of the entire composition is typically from 1.5 to 2 centipoise (cp).

Photoresist Compositions

Photoresist compositions useful in the invention include, for example, chemically-amplified photoresist compositions comprising a matrix resin that is acid-sensitive, meaning that as part of a layer of the photoresist composition, the resin and composition layer undergo a change in solubility in an organic developer as a result of reaction with acid generated by a photoacid generator following soft bake, exposure to activating radiation and post exposure bake. The photoresist composition can be positive acting or negative acting. The change in solubility is brought about when acid-cleavable leaving groups such as photoacid-labile ester or acetal groups in the matrix polymer undergo a photoacid-promoted deprotection reaction on exposure to activating radiation and heat treatment to produce an acid or an alcohol group.

The matrix polymers typically include, one or more acid labile groups, one or more of polar groups (e.g., lactone, hydroxy adamantyl, hydroxy vinyl naphthalene) and one or more non-polar groups (e.g., adamantyl). Preferable acid labile groups include, for example, acetal groups or ester groups that contain a tertiary non-cyclic alkyl carbon (e.g., t-butyl) or a tertiary alicyclic carbon (e.g., methyladamantyl) covalently linked to a carboxyl oxygen of an ester of the matrix polymer. Suitable matrix polymers further include polymers that contain (alkyl)acrylate units, preferably including acid-labile (alkyl)acrylate units, such as t-butyl acrylate, t-butyl methacrylate, methyl adamantyl acrylate, methyl adamantyl methacrylate, ethylfenchyl acrylate, ethylfenchyl methacrylate, and the like, and other non-cyclic alkyl and alicyclic (alkyl)acrylates. For imaging at certain sub-200 nm wavelengths such as 193 nm, the matrix polymer is typically substantially free (e.g., less than 15 mole %) or completely free of phenyl, benzyl or other aromatic groups where such groups are highly absorbing of the radiation.

Suitable matrix polymers for use in the photoresist compositions are commercially available and can readily be made by persons skilled in the art. The matrix polymer is present in the resist composition in an amount sufficient to render an exposed coating layer of the resist developable in a suitable developer solution. Typically, the matrix polymer is present in the composition in an amount of from 50 to 95 wt % based on total solids of the resist composition. The weight average molecular weight $M_w$ of the matrix polymer is typically less than 100,000, for example, from 5000 to 100,000, more typically from 5000 to 15,000 Daltons.

The photoresist composition further comprises a photoacid generator (PAG) employed in an amount sufficient to generate a latent image in a coating layer of the composition upon exposure to activating radiation. For example, the photoacid generator will suitably be present in an amount of from about 1 to 20 wt % based on total solids of the photoresist composition. Typically, lesser amounts of the PAG will be suitable for chemically amplified resists as compared with non-chemically amplified materials. Suitable PAGs are known in the art of chemically amplified photoresists.

Suitable solvents for the photoresist compositions include, for example: glycol ethers such as 2-methoxyethyl ether (diglyme), ethylene glycol monomethyl ether, and propylene glycol monomethyl ether; propylene glycol monomethyl ether acetate; lactates such as methyl lactate and ethyl lactate;

propionates such as methyl propionate, ethyl propionate, ethyl ethoxy propionate and methyl-2-hydroxy isobutyrate; Cellosolve esters such as methyl Cellosolve acetate; aromatic hydrocarbons such as toluene and xylene; and ketones such as acetone, methylethyl ketone, cyclohexanone and 2-heptanone. A blend of solvents such as a blend of two, three or more of the solvents described above also are suitable. The solvent is typically present in the composition in an amount of from 90 to 99 wt %, more typically from 95 to 98 wt %, based on the total weight of the photoresist composition.

The photoresist compositions can further include other optional materials. For example, the compositions can include one or more of added bases, actinic and contrast dyes, anti-striation agents, plasticizers, speed enhancers, sensitizers, and the like. Such optional additives if used are typically present in the composition in minor amounts such as from 0.1 to 10 wt % based on total solids of the photoresist composition.

The photoresists can be prepared following known procedures. For example, the resists can be prepared as coating compositions by dissolving the components of the photoresist in a suitable solvent. The desired total solids content of the photoresist will depend on factors such as the particular polymers in the composition, final layer thickness and exposure wavelength. Typically, the solids content of the photoresist varies from 1 to 10 wt %, more typically from 2 to 5 wt %, based on the total weight of the photoresist composition.

Lithographic Processing

Photoresist compositions can be applied to a substrate such as by spin coating, dipping, roller coating or other conventional coating technique, with spin coating being typical. When spin coating, the solids content of the coating solution can be adjusted to provide a desired film thickness based upon the specific spinning equipment utilized, the viscosity of the solution, the speed of the spinner and the amount of time allowed for spinning.

Photoresist compositions used in accordance with the invention are suitably applied to substrates conventionally used in processes involving coating with photoresists. For example, the composition may be applied over silicon wafers or silicon wafers coated with one or more layers to be patterned, for example, one or more of metal, semiconductor and dielectric layers. Aluminum-aluminum oxide, gallium arsenide, ceramic, quartz, copper, glass substrates and the like may also be suitably employed. Photoresists also may be suitably applied over an antireflective layer. The photoresist composition is typically next soft-baked by heating to remove the solvent until the photoresist coating is tack free. The photoresist layer may alternatively be dried after the topcoat composition has been applied and the solvent from both the photoresist composition and topcoat composition layers substantially removed in a single thermal treatment step.

A topcoat composition of the invention can be applied over the photoresist composition by any suitable method such as described above with reference to the photoresist compositions, with spin coating being typical. The photoresist layer with topcoat composition layer is then patternwise exposed to activating radiation for the photoactive component(s) of the photoresist. In an immersion lithography system, the space between the exposure tool (particularly the projection lens) and the photoresist coated substrate is occupied by an immersion fluid, such as water optionally mixed with one or more additives such as cesium sulfate which can provide a fluid of enhanced refractive index. Typically, the immersion fluid has been treated to avoid microbubble formation.

During the exposure step (whether immersion where fluid is interposed, or non-immersion where such fluid is not interposed), the photoresist composition layer is exposed to patterned activating radiation with the exposure energy typically ranging from about 1 to 100 mJ/cm$^2$, dependent upon the exposure tool and the components of the photoresist composition. References herein to exposing a photoresist composition to radiation that is activating for the photoresist indicates that the radiation is capable of forming a latent image in the photoresist such as by causing a reaction of the photoactive component, for example, producing photoacid from a photoacid generator compound.

The photoresist composition (and topcoat composition if photosensitive) is typically photoactivated by a short exposure wavelength, for example, radiation having a wavelength of less than 300 nm such as 248 nm, 193 nm and EUV wavelengths.

Following exposure, the layer of the composition is baked to complete the photoreaction initiated during exposure, and to activate the thermal acid generator and allow the generated acid to diffuse into the surface of the resist pattern to cause a polarity-changing reaction in the resist pattern surface region. The bake can be conducted with a hotplate or oven, with a hotplate being typical. Suitable bake temperatures are greater than 50° C., for example, greater than 70° C., greater than 90° C., greater than 120° C. or greater than 150° C., with a temperature of from 70 to 160° C. and a time of from about 30 to 90 seconds being typical. While a single baking step is typical, multiple-step baking can be used and may be useful for resist profile adjustment.

Thereafter, the film is developed, typically by treatment with an aqueous base developer chosen from: quaternary ammonium hydroxide solutions such as aqueous tetra-alkyl ammonium hydroxide solutions, typically a 2.38 wt % or 5 wt % tetramethylammonium hydroxide aqueous solution; amine solutions such as ethyl amine, n-propyl amine, diethyl amine, di-n-propyl amine, triethyl amine, or methyldiethyl amine; alcohol amines such as diethanol amine or triethanol amine; and cyclic amines such as pyrrole or pyridine. In general, development is in accordance with procedures recognized in the art.

Following development of the photoresist coating over the substrate, the developed substrate may be selectively processed on those areas bared of resist, for example by etching or plating substrate areas bared of resist in accordance with procedures known in the art. After such processing, resist may be removed from the processed substrate using known stripping procedures. The following non-limiting examples are illustrative of the invention.

EXAMPLES

Polymer Synthesis

The following monomers were used to synthesize polymers as described below, with monomer ratios provided as mole percentage (mol %) based on the polymer:

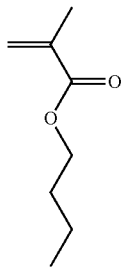

(M-1)

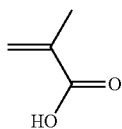

(M-2)

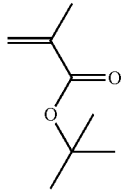

(M-3)

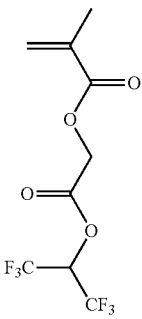

(M-4)

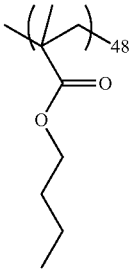

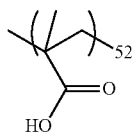

(MP-1)

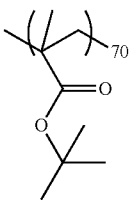

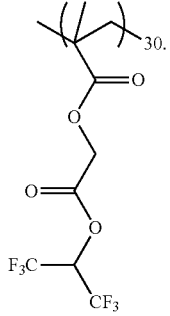

(SAP-1)

Matrix Polymer MP-1 Synthesis

A monomer feed solution was prepared by combining 10 g 4-methyl-2-pentanol (4M2P), 6 g monomer M1 and 4 g monomer M2 in a container, and agitating the mixture to dissolve the two monomers. An initiator feed solution was prepared by combining 0.61 g Wako V-601 initiator (E. I. du Pont de Nemours and Company) and 6.2 g 4M2P in a container, and agitating the mixture to dissolve the initiator. 13.3 g 4M2P was introduced into a reaction vessel and the vessel was purged with nitrogen for 30 minutes. The reaction vessel was next heated to 88° C. with agitation. The monomer feed solution and initiator feed solution were simultaneously introduced into the reaction vessel. The monomer feed solution was fed over a period of 1.5 hours and the initiator feed solution over a period of two hours. The reaction vessel was maintained at 88° C. for an additional three hours with agitation, and was then allowed to cool to room temperature. Matrix polymer MP-1 was thereby formed [Mw=13.6 kDa, PDI=2.4].

Surface Active Polymer SAP-1 Synthesis:

A monomer feed solution was prepared by combining 57.1 g monomer M3, 50.7 g monomer M4 and 15.1 g propylene glycol monomethyl ether acetate (PGMEA) in a container. The mixture was agitated to dissolve the monomers. An initiator feed solution was prepared by combining 3.9 g Wako V-601 initiator and 34.9 g PGMEA in a container. The mixture was agitated to dissolve the initiator. 54.0 g PGMEA was introduced into a reaction vessel and the vessel was purged with nitrogen for 30 minutes. The reaction vessel was next heated to 99° C. with agitation. The monomer feed solution and initiator feed solution were simultaneously introduced into the reaction vessel for a period of two hours. The reaction vessel was maintained at 99° C. for an additional two hours. The reaction mixture was then allowed to cool to room temperature. Surface active polymer SAP-1 was thereby formed [Mw=11.7 kDa, PDI=2.0].

Thermal Acid Generator Synthesis

The following thermal acid generators were synthesized as described below:

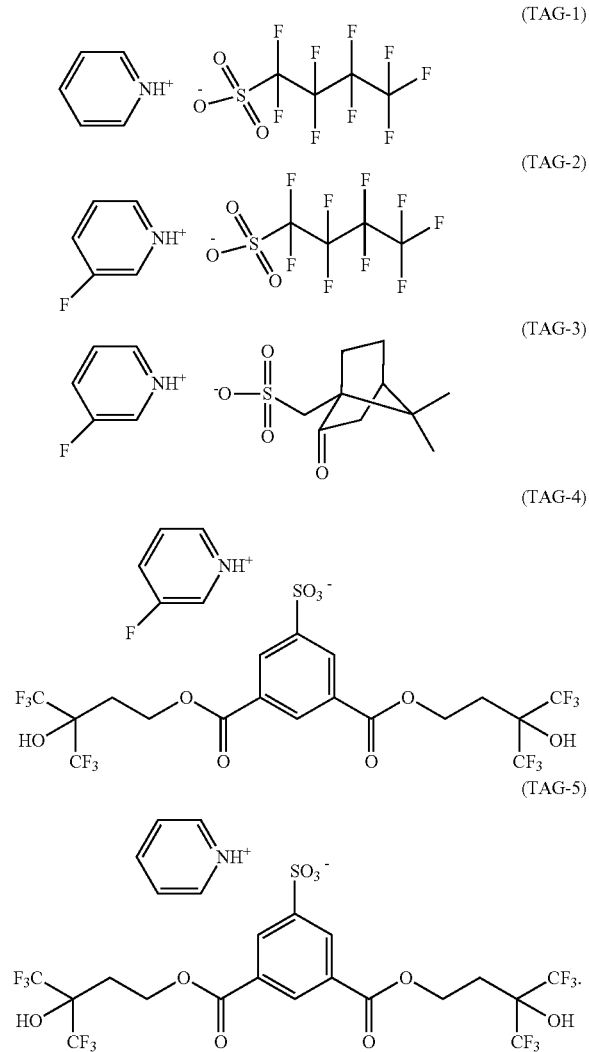

Thermal Acid Generator TAG-1 Synthesis

Pyridine (5 g, 0.063 mol) was added to a solution of 1,1,2,2,3,3,4,4,4-nonafluorobutane-1-sulfonic acid (14.64 g, 0.049 mol) in methanol (250 mL). The resulting mixture was stirred overnight at room temperature. The resulting reaction mixture was concentrated under reduced pressure to yield a solid crude product, which was then washed with heptane (300 mL). The solids were filtered and washed with methyl tertiary butyl ether (100 mL) to yield thermal acid generator TAG-1 at a 90% yield. [$^1$H NMR (CDCl$_3$, 500 MHz): δ 8.50 (m, 2H), 9.16 (m, 1H), 9.23 (m, 2H). $^{19}$F NMR ((CD$_3$)$_2$CO, 500 MHz): δ–115.65, –117.92, –122.25, –126.79.]

Thermal Acid Generator TAG-2 Synthesis

3-Fluoropyridine (20 g, 0.21 mol) was added to a solution of 1,1,2,2,3,3,4,4,4-nonafluorobutane-1-sulfonic acid (56 g, 0.186 mol) in methanol (250 mL). The resulting mixture was stirred overnight at room temperature. The resulting reaction mixture was concentrated under reduced pressure to yield a solid crude product, which was then washed with heptane (300 mL). The solids were filtered and washed with methyl tertiary butyl ether (100 mL) to yield thermal acid generator TAG-2 at an 80% yield. [$^1$H NMR (CDCl$_3$, 500 MHz): δ 9.184 (s, 1H), 9.01 (m, 1H), 8.72 (m, 1H), 8.39 (m, 1H), 7.07 (bs, 1H). $^{19}$F NMR ((CD$_3$)$_2$CO, 500 MHz): δ–82.26, –115.65, –117.92, –122.25, –126.79.]

Thermal Acid Generator TAG-3 Synthesis

3-Fluoropyridine (10 g, 0.102 mol) was added to a solution of camphor sulfonic acid (20 g, 0.086 mol) in methanol (200 mL). The resulting mixture was stirred overnight at room temperature. The reaction mixture was concentrated under reduced pressure to yield a solid crude product, which was then washed with heptane (200 mL). The solids were filtered and washed with methyl tertiary butyl ether (100 mL) to yield thermal acid generator TAG-3 at a 75% yield. [$^1$H NMR ((CD$_3$)$_2$CO, 500 MHz): δ 0.9 (s, 3H), 1.2 (2, 3H), 1.4 (t, 1H), 1.7 (t, 1H), 1.85 (m, 1H), 2.0 (m, 2H), 2.25 (d, 1H), 2.85 (m, 2H), 3.4 (d, 1H), 9.18 (s, 1H), 9.01 (m, 1H), 8.72 (m, 1H), 8.39 (m, 1H), 7.07 (bs, 1H). 19F NMR ((CD$_3$)$_2$CO, 500 MHz): δ-82.3].

Thermal Acid Generator TAG-4 Synthesis

5-Sulfoisophthalic acid (6.3 g, 24.3 mmol) as a 50 wt % water solution was mixed with 15 g (70.7 mmol) 4,4,4-trifluoro-3-(trifluoromethyl)butane-1,3-diol at room temperature, under nitrogen flow. The temperature of the reaction mixture was next increased to 110-120° C., and the reaction was carried out for 2-3 hours with constant evaporation of water as a side product. The reaction mixture was then poured into a 1M HCl aqueous solution. After 5-10 minutes, the mixture separated into two layers. The organic layer was recovered, washed three times with 1M HCl aqueous solution, and then extracted with diethyl ether. The crude product was then dried over MgSO$_4$. The volatile contaminants were removed by rotary evaporation to yield a crude product. The crude product was next washed with heptane:acetone (8:2 by volume) to yield solid 3,5-bis((4,4,4-trifluoro-3-hydroxy-3-(trifluoromethyl)butoxy)carbonyl) benzenesulfonic acid (SIPA-DiHFA) in a 64% yield. [$^1$H NMR ((CD$_3$)$_2$CO, 500 MHz): δ 2.63 (t, 4H), 4.68 (t, 4H), 7.11 (bs, 3H), 8.68 (m, 3H). 19F NMR ((CD$_3$)$_2$CO, 500 MHz): δ-76.56]. 3-Fluoropyridine (7 g, 72.14 mmol) was added to a solution of the SIPA-DiHFA (32 g, 48.33 mmol) in methanol (200 mL). The resulting mixture was stirred overnight at room temperature. The reaction mixture was concentrated under reduced pressure to yield a crude product. Heptane (300 mL) was added to the resulting crude product and the mixture was allowed to stand for several hours to yield a solid product. The solid product was filtered and washed with heptane and dichloromethane to yield thermal acid generator TAG-4 at a 90% yield. [$^1$H NMR (CDCl$_3$, 500 MHz): δ 2.17 (t, 4H), 4.14 (t, 4H), 7.30 (m, 4H), 8.45 (m, 3H). $^{19}$F NMR ((CD$_3$)$_2$CO, 500 MHz): δ–76.56, –123.06.]

Thermal Acid Generator TAG-5 Synthesis

Pyridine (2 g, 0.025 mol) was added to a solution of SIPA-DiHFA (10 g, 0.015 mol) (as prepared for TAG-4) in methanol (200 mL). The resulting mixture was stirred overnight at room temperature. The resulting mixture was concentrated under reduced pressure. Heptane (100 mL) was added to the resulting crude product and the mixture was allowed to stand for several hours to yield a solid product. The solid product was filtered and washed with heptane and dichloromethane to yield thermal acid generator TAG-5 at a 90% yield. [$^1$H NMR ((CD$_3$)$_2$CO, 500 MHz): δ 2.63 (t, 4H), 4.68 (t, 4H), 7.11 (bs, 3H), 8.68 (m, 3H), 8.50 (m, 2H), 9.16 (m, 1H), 9.23 (m, 2H). $^{19}$F NMR ((CD$_3$)$_2$CO, 500 MHz): δ-76.62.]

Topcoat Composition Preparation

Topcoat compositions were formulated by adding matrix polymer MP-1, surface active polymer SAP-1 and a thermal acid generator to a solvent system including 4-methyl-2-pentanol, dipropylene glycol methyl ether and isobutyl isobutyrate, in the amounts as described in Table 1. Each mixture was filtered through a 0.2 μm PTFE disk.

TABLE 1

| Ex. | TC | MP-1 | SAP-1 | TAG | PAG | 4M2P* | IBIB | DPM | PGMEA** |
|---|---|---|---|---|---|---|---|---|---|
| 1(Comp) | TC-1 | 1.262 | 0.173 | — | 0.014 | 55.877 | 40.193 | 1.961 | 0.519 |
| 2 | TC-2 | 1.255 | 0.173 | TAG-1 0.007 | 0.014 | 55.877 | 40.193 | 1.961 | 0.519 |
| 3 | TC-3 | 1.255 | 0.173 | TAG-2 0.007 | 0.014 | 55.877 | 40.193 | 1.961 | 0.519 |
| 4 | TC-4 | 1.180 | 0.173 | TAG-3 0.082 | 0.014 | 55.877 | 40.193 | 1.961 | 0.519 |
| 5 | TC-5 | 1.219 | 0.173 | TAG-4 0.044 | 0.014 | 55.877 | 40.193 | 1.961 | 0.519 |
| 6 | TC-6 | 1.204 | 0.173 | TAG-5 0.058 | 0.014 | 55.877 | 40.193 | 1.961 | 0.519 |

All amounts in grams; Comp = comparative example; TC = Topcoat Composition; MP = Matrix Polymer; SAP = Surface Active Polymer; TAG = Thermal Acid Generator; PAG = (4-(2-(tert-butoxy)-2-oxoethoxy)phenyl) diphenylsulfonium 1,1,2,2,3,3,4,4,4-nonafluorobutane-1-sulfonate; 4M2P = 4-Methyl-2-Pentanol; DPM = Dipropylene Glycol Methyl Ether; IBIB = Isobutyl Isobutyrate; PGMEA = Propylene Glycol Methyl Ether Acetate;
*Total 4M2P includes solvent from MP-1 solution and added solvent;
**Total PGMEA is from SAP-1 solution.

Contact Angle Measurements 200 mm silicon wafers were primed with HMDS at 120° C. for 30 seconds and coated on a TEL ACT-8 wafer track with EPIC™ 2135 positive photoresist (Dow Electronic Materials) to a thickness of 1200 Å on primed silicon. Topcoat compositions were coated on a respective resist-coated wafer to a thickness of 385 Å and then baked at 90° C. for 60 seconds on the same wafer track. Receding contact angle (RCA) with respect to DI water was measured for each sample. RCA was measured using a KRUSS drop shape analyzer model 100. The droplet size of DI water was 50 μL, and the wafer stage tilting rate was 1 unit/sec. Once a water droplet was placed on a test wafer surface, tilting of the wafer stage was immediately started. During wafer stage tilting, video of the droplet was taken at a rate of 20 frames per second until the droplet started to slide away from its original location. Each frame in the video was analyzed, and the image of the droplet on the frame when the droplet started to slide was used to determine the RCA by its corresponding tangent lines. The results are shown in Table 2.

Unexposed Film Thickness Loss (UFTL) Measurements

On a TEL ACT-8 track, 200 mm silicon wafers were primed with HMDS at 120° C. for 30 seconds and then coated with EPIC™ 2135 photoresist to a dried thickness of 2000 Å. The wafers were softbaked at 110° C. for 60 seconds. Each topcoat composition was coated over the photoresist layer of a respective wafer and softbaked at 90° C. for 60 seconds to a dried thickness of 385 Å. The wafers were then baked at 110° C. for 60 seconds, developed in 0.26N TMAH developer solution for 60 seconds, rinsed with distilled water and spin-dried. The remaining photoresist film thickness was measured and unexposed film thickness loss (UFTL) was calculated as initial photoresist film thickness after coating minus remaining photoresist film thickness after development. The results are shown in Table 2.

Pattern Collapse (PC) Determination 200 mm silicon wafers coated with AR™ 40A antireflectant material (Dow Electronic Materials) to a dried thickness of 80 nm were spin-coated with EPIC™ 2135 photoresist and softbaked at 110° C. for 90 seconds to provide a resist layer thickness of 2950 Å. Over the photoresist, each topcoat composition was coated and softbaked at 90° C. for 60 seconds to provide a thickness of 385 Å. Each wafer was exposed at a range of doses ranging from 27 mJ/cm$^2$ to 43 mJ/cm$^2$ using an ASML ArF 1100 scanner with NA=0.75, annular illumination (0.89/0.64 sigma), using a binary mask having dense trench/line pattern with feature size of 90 nm 1:1. The exposed wafers were post-exposure baked at 110° C. for 60 seconds and developed with 0.26N TMAH developer solution to form trench/line photoresist patterns of various critical dimensions (CDs). CDs of the trenches were determined by processing the image captured by top-down scanning electron microscopy (SEM) using a Hitachi 9380 CD-SEM. The patterns were observed for pattern collapse. The CDs of the largest non-collapsed trenches (CD$_{PC}$) are reported in Table 2, with larger CD$_{PC}$ values indicating better pattern collapse performance

TABLE 2

| Example | TC | RCA (°) | UFTL (Å) | CD$_{PC}$ (nm) |
|---|---|---|---|---|
| 7 (Comp) | TC-1 | 83 | 45 | 91.7 |
| 8 | TC-2 | 81.4 | 55 | 93.3 |
| 9 | TC-3 | 82.2 | 51 | 93.3 |
| 10 | TC-4 | 83.4 | 99 | 93.5 |
| 11 | TC-5 | 83.1 | 78 | 91.9 |
| 12 | TC-6 | 82.8 | 74 | 97.8 |

Immersion Lithography 200 mm silicon wafers are spin coated with AR™ 40A antireflectant (Dow Electronic Materials) and baked for 60 seconds at 215° C. to form a 75 nm first bottom antireflective coating (BARC) layer. AR™124 antireflectant (Dow Electronic Materials) is coated over the first BARC layer and baked at 205° C. for 60 seconds to form a 23 nm top BARC layer. The wafers are coated with EPIC™ 2096 positive photoresist (Dow Electronic Materials) to a dried thickness of 1200 Å. Topcoat Compositions TC-2~TC-6 are coated on the resist-coated wafers to a thickness of 385 Å and then baked at 90° C. for 60 seconds. The wafers are exposed through a patterned photomask having line and space patterns on an immersion scanner. The wafers are post-exposure baked at 100° C. for 60 seconds and developed for 12 seconds with 0.26N TMAH developer solution. It is expected that photoresist line and space patterns are formed.

What is claimed is:

1. A topcoat composition, comprising:
   a matrix polymer;
   a surface active polymer;
   an ionic thermal acid generator comprising an anion and a cation, wherein the anion, the cation, or the anion and the cation are fluorinated; and
   a solvent.

2. The topcoat composition of claim 1, wherein the anion is fluorinated.

3. The topcoat composition of claim 1, wherein the cation is fluorinated.

4. The topcoat composition of claim 1, wherein the anion is polycyclic.

5. The topcoat composition of claim 1, wherein the ionic thermal acid generator comprises a fluorinated alcohol group comprising a fluorine atom bonded to a carbon at the alpha position of the hydroxyl group and/or a fluorinated group bonded pendant to a carbon at the alpha position of the hydroxyl group.

6. The topcoat composition of claim 5, wherein the fluorinated alcohol group is bonded to an aromatic ring of the anion through an ester group.

7. The topcoat composition of claim 6, wherein the anion comprises a plurality of fluorinated alcohol groups bonded to the aromatic ring through a respective ester group.

8. The topcoat composition of claim 1, wherein the ionic thermal acid generator comprises a nitrogen-containing cation.

9. The topcoat composition of claim 1, further comprising a photoacid generator.

10. The topcoat composition of claim 1, wherein the solvent comprises a mixture of organic solvents comprising a first organic solvent having a boiling point of from 120 to 140° C., a second organic solvent having a boiling point of from 140 to 180° C. and a third organic solvent having a boiling point of from 170 to 200° C.

11. A coated substrate, comprising: a semiconductor substrate; a photoresist layer over the semiconductor substrate; and a topcoat layer over the photoresist layer, wherein the topcoat layer is formed from a topcoat composition of claim 1.

12. A pattern-forming method, comprising:
   (a) forming a photoresist layer over a substrate;
   (b) forming a topcoat layer over the photoresist layer, wherein the topcoat layer is formed from a topcoat composition of claim 1;
   (c) exposing the topcoat layer and the photoresist layer to activating radiation; and
   (d) contacting the exposed topcoat layer and photoresist layer with a developer to form a photoresist pattern.

13. The pattern-forming method of claim 12, wherein the anion is fluorinated.

14. The pattern-forming method of claim 12, wherein the cation is fluorinated.

15. The pattern-forming method of claim 12, wherein the anion is polycyclic.

16. The pattern-forming method of claim 12, wherein the ionic thermal acid generator comprises a fluorinated alcohol group comprising a fluorine atom bonded to a carbon at the alpha position of the hydroxyl group and/or or a fluorinated group bonded pendant to a carbon at the alpha position of the hydroxyl group.

17. The pattern-forming method of claim 16, wherein the fluorinated alcohol group is bonded to an aromatic ring of the anion through an ester group.

18. The pattern-forming method of claim 17, wherein the anion comprises a plurality of fluorinated alcohol groups bonded to the aromatic ring through a respective ester group.

19. The pattern-forming method of claim 12, wherein the ionic thermal acid generator comprises a nitrogen-containing cation.

20. The pattern-forming method of claim 12, further comprising a photoacid generator.

* * * * *